(12) United States Patent
Sprague et al.

(10) Patent No.: US 6,496,038 B1
(45) Date of Patent: Dec. 17, 2002

(54) PULSED CIRCUIT TOPOLOGY INCLUDING A PULSED, DOMINO FLIP-FLOP

(75) Inventors: Milo D. Sprague, Hudson, MA (US); Rajesh Kumar; Robert J. Murray, both of Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/608,857

(22) Filed: Jun. 30, 2000

(51) Int. Cl.[7] .............................................. H03K 19/096
(52) U.S. Cl. ......................................... 326/95; 327/142
(58) Field of Search ............................... 326/93–98, 83; 327/142, 144, 198

(56) References Cited

U.S. PATENT DOCUMENTS

| | | | |
|---|---|---|---|
| 5,226,011 A | | 7/1993 | Yanagisawa |
| 5,453,708 A | * | 9/1995 | Gupta et al. ................... 326/98 |
| 5,467,037 A | | 11/1995 | Kumar et al. |
| 5,491,442 A | | 2/1996 | Mirov et al. |
| 5,517,136 A | | 5/1996 | Harris et al. |
| 5,535,343 A | | 7/1996 | Verseput |
| 5,708,374 A | | 1/1998 | Durham et al. |
| 5,721,875 A | | 2/1998 | Fletcher |
| 5,764,084 A | | 6/1998 | Lev |
| 5,796,282 A | * | 8/1998 | Sprague et al. .............. 327/210 |
| 5,828,234 A | | 10/1998 | Sprague |
| 5,831,932 A | | 11/1998 | Merritt et al. |
| 5,880,608 A | | 3/1999 | Mehta et al. |
| 5,892,372 A | * | 4/1999 | Ciraula et al. ................ 326/96 |
| 5,942,917 A | | 8/1999 | Chappell et al. |
| 5,952,859 A | | 9/1999 | Kim et al. |
| 5,973,514 A | | 10/1999 | Kuo et al. |
| 5,986,475 A | | 11/1999 | Kim et al. |
| 6,011,410 A | * | 1/2000 | Kim et al. ..................... 326/98 |
| 6,023,182 A | * | 2/2000 | Milshtein et al. ............ 327/299 |
| 6,040,716 A | | 3/2000 | Bosshart |
| 6,094,071 A | | 7/2000 | Ciraula et al. |
| 6,172,530 B1 | | 1/2001 | Bull et al. |
| 6,201,415 B1 | | 3/2001 | Manglore |
| 6,201,431 B1 | | 3/2001 | Allen et al. |
| 6,204,714 B1 | | 3/2001 | Milshtein et al. |
| 6,239,621 B1 | * | 5/2001 | Milshtein et al. .............. 326/95 |
| 6,242,958 B1 | | 6/2001 | Fletcher |
| 6,275,069 B1 | * | 8/2001 | Chung et al. .................. 326/98 |
| 6,320,441 B1 | | 11/2001 | Fletcher et al. |
| 6,331,793 B1 | | 12/2001 | Fletcher et al. |

FOREIGN PATENT DOCUMENTS

WO    WO 98/29949    9/1998

OTHER PUBLICATIONS

Alisa Scherer et al., An Out–of Order Three–Way Superscalar Multimedia Floating–Point Unit 1999, pp. 94–95, 449, Advanced Micro Devices, Sunnyvale, CA.

* cited by examiner

Primary Examiner—Daniel D. Chang
(74) Attorney, Agent, or Firm—Cynthia T. Faatz

(57) ABSTRACT

A pulsed circuit topology including a pulsed domino flip-flop. A circuit includes a domino logic gate having a domino output node responsive to input data during an evaluate pulse. Reset circuitry initiates and self-terminates a reset pulse during which the domino output node is precharged. A latch responsive to a first pulsed clock input signal is provided to latch data indicated at the domino output node.

22 Claims, 17 Drawing Sheets

PULSED CIRCUIT TOPOLOGY INCLUDING A PULSED, DOMINO FLIP-FLOP

CROSS-REFERENCE TO RELATED APPLICATIONS

This application is related to copending U.S. patent applications Ser. No. 09/607,897, entitled, "Pulsed Circuit Topology to Perform a Memory Array Write Operation," Ser. No. 09/608,389, entitled, "A Global Clock Self-Timed Circuit with Self-Terminating Precharge for High Frequency Applications," and Ser. No. 09/608,638, entitled, "Reset First Latching Mechanism for Pulsed Circuit Topologies," each of which is concurrently filed herewith.

BACKGROUND

1. Field

An embodiment of the present invention relates to the field of high frequency integrated circuits and, more particularly, to high frequency integrated circuits that include domino logic.

2. Discussion of Related Art

Advances in semiconductor manufacturing technologies have enabled circuit designers to continue to integrate more transistors on a single die. At the same time, computer architecture, and more specifically, processor architecture, continues to focus on shorter and shorter cycle times.

Domino logic is frequently used in an effort to reduce power, die area and output capacitance as compared to static full complementary metal oxide semiconductor (CMOS) logic. The reduction in parasitic capacitance provided by domino CMOS logic permits higher speed and lower power operation.

As clock speeds continue to increase (and thus, cycle times continue to decrease) and/or where certain parts of a chip operate at a much higher frequency, limitations of conventional logic circuits, including conventional domino logic circuits, may prevent such circuits from operating properly at the higher clock speeds. Further, many conventional domino logic circuits operate using a two-phase clock. For very high operating frequencies, it may not be feasible to generate and distribute a two-phase clock due to noise, clock jitter and/or other issues.

Where a pulsed clock is used instead of a conventional two-phase clock, the logic may be more susceptible to functional errors due to race conditions making such circuits more difficult for design engineers to work with.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A pulsed circuit topology including a pulsed, domino flip-flop is described. In the following description, particular types of integrated circuits and integrated circuit configurations are described for purposes of illustration. It will be appreciated, however, that other embodiments are applicable to other types of integrated circuits and to integrated circuits configured in another manner.

For one embodiment, a circuit includes a domino logic gate having a domino output node responsive to input data during an evaluate pulse. Reset circuitry initiates and self-terminates a reset pulse during which the domino output node is precharged. A latch responsive to a first pulsed clock input signal is provided to latch data indicated at the domino output node. Additional details of this and other embodiments are provided in the description that follows.

The pulsed circuit topology of various embodiments may be particularly useful for interfacing between logic, communicating signals that are to be transmitted over relatively long distances and/or staging circuitry within a functional unit block (FUB), for example. Other uses will be appreciated by those of ordinary skill in the art.

Figure 1:
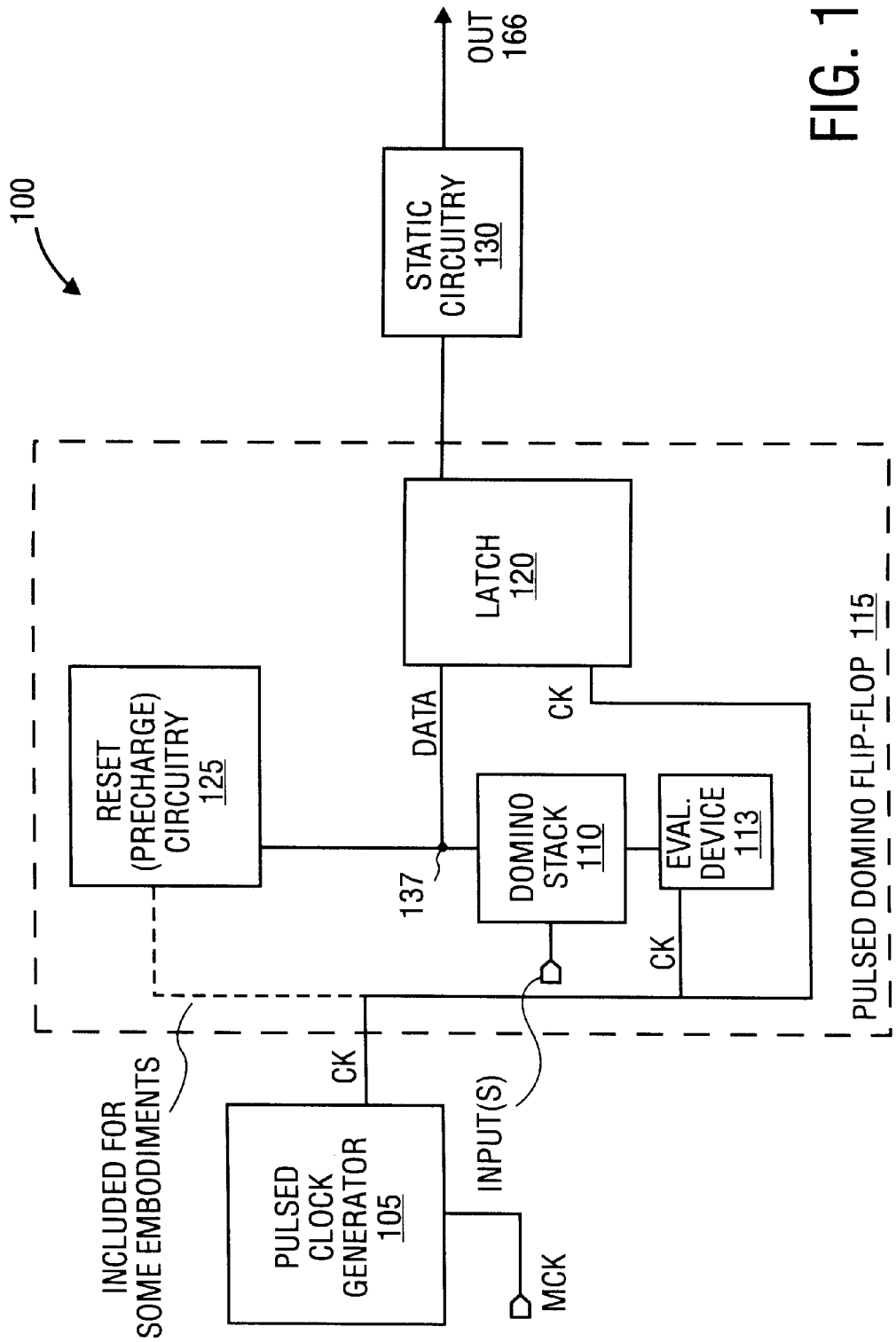
FIG. 1 is a block diagram of the pulsed circuit topology of one embodiment that includes a pulsed domino flip-flop.

FIG. 1 is a block diagram of a circuit 100 that illustrates the pulsed circuit topology of one embodiment. For the embodiment of FIG. 1, a pulsed, domino flip-flop 115 receives a pulsed clock signal from a pulsed clock source such as a pulsed clock generator 105. The pulsed, domino flip-flop 115 includes a domino stack 110, an evaluate device 113, a latch 120 and reset (also referred to herein as precharge) circuitry 125. The latch 120 provides a static data output signal to static circuitry 130 which may comprise multiple static logic stages, for example, and may additionally include interface circuitry to interface the circuit 100 (also referred to as a pipestage) to subsequent circuitry (not shown) at an output node 166. For some embodiments, one or more static logic stages may be implemented using ratioed logic in accordance with U.S. Pat. No. 5,942,917 to Chappell et al. entitled, "High Speed Ratioed CMOS Logic Structures for a Pulsed Input Environment," issued Aug. 24, 1999 and assigned to the assignee of the present invention. Such ratioed logic may be particularly useful, for example, where global reset circuitry is used. Node 137 is referred to herein as a domino node. The voltage at the domino node 137 varies in response to the reset circuitry 125 during a reset pulse and varies in response to the domino stack 110 during an evaluate pulse as described in more detail below.

For some embodiments, a separate domino stack and evaluate device may not be included and instead, only an evaluate device is included.

Figure 2:
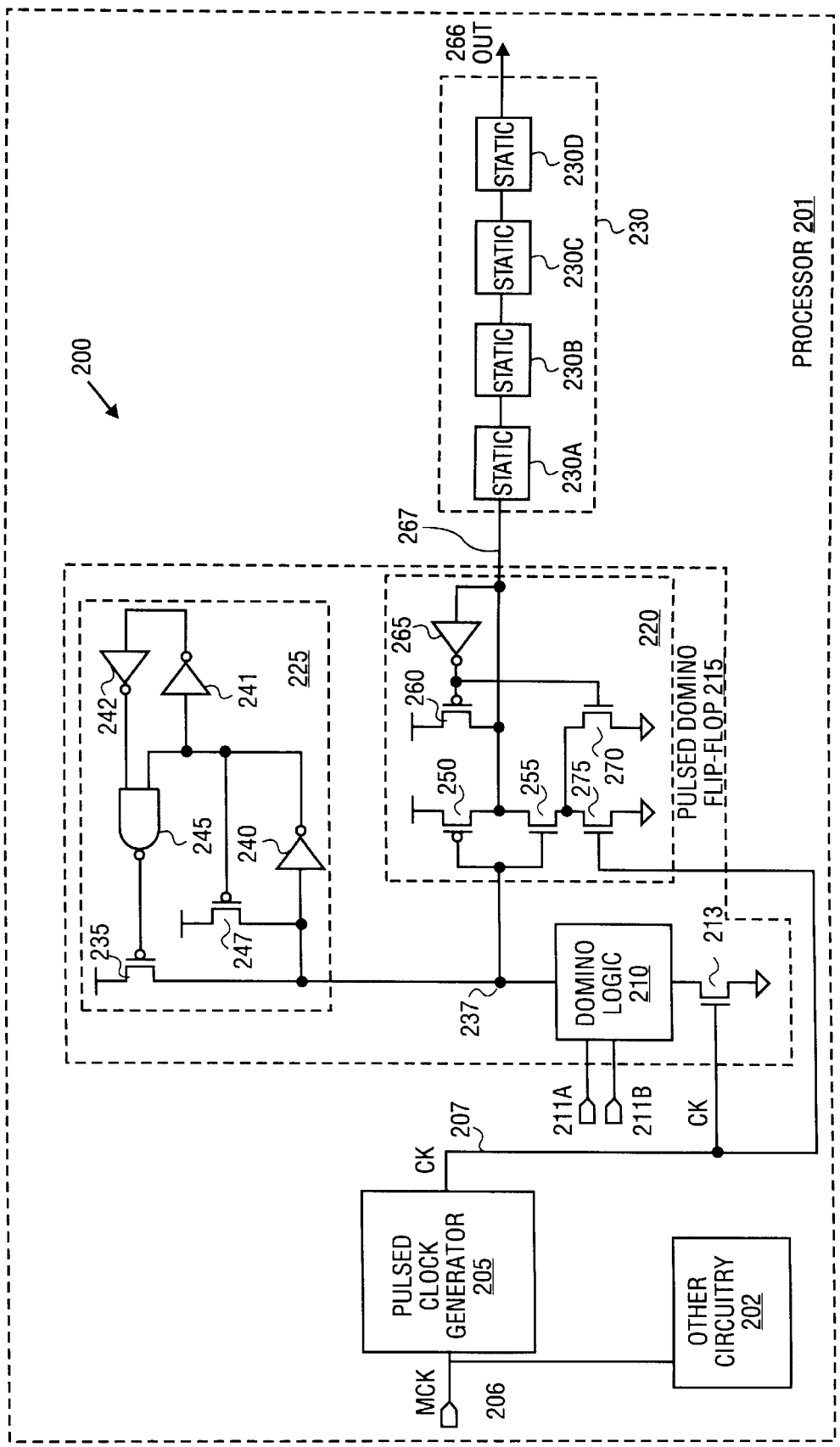
FIG. 2 is a schematic diagram of the pulsed circuit topology of one embodiment that includes a self-resetting, pulsed domino flip-flop.

FIG. 2 is a schematic diagram of a circuit 200 that illustrates the pulsed circuit topology of one embodiment in more detail. The circuit 200 may be included in a high-frequency microprocessor 201, for example, or in another type of circuit that operates at a high frequency.

The circuit 200 of FIG. 2 includes a pulsed, self-resetting domino flip-flop 215 and static logic 230. The pulsed, self-resetting domino flip-flop 215 includes n-type domino logic 210 (also referred to as a domino stack or an evaluate stack), an n-type evaluate device 213, a set dominant latch 220 and a self-resetting loop 225 (also referred to herein as an atomic reset stage, loop or circuit). The static logic includes static logic stages 230a–d for this embodiment. It will be appreciated, however, that, while four static logic stages are shown in FIG. 2, for other embodiments, the circuit 200 may include a different number of static logic stages.

For one embodiment, a pulsed clock generator 205 provides a pulsed clock signal (Ck) that is received by the domino logic 210 and the set dominant latch 220. For one embodiment, the pulsed clock generator 205 receives a conventional single wire, two-phase input clock signal MCk at an input 206 and provides a double-frequency (i.e. two pulses for each MCk cycle), pulsed, single-phase clock signal Ck at an output 207. Where the circuit 200 is included in a microprocessor, the input clock signal MCk may be, for example, the processor clock that is used to clock other surrounding circuitry 202. It will be appreciated that the input clock signal MCk may be a different type of clock signal and/or may be provided from a different source. It will also be appreciated that the pulsed clock signal Ck may be any type of pulsed clock signal at any one of a range of frequencies and may have any one of a variety of frequency relationships with respect to the MCk signal. Examples of circuits that may be used to implement the pulsed clock generator 205 of some embodiments are described in U.S. Pat. No. 6,023,182 to Milshtein et al. entitled, "High Gain Pulse Generator," issued Feb. 8, 2000 and in U.S. Pat. No. 6,204,714 entitled "Variable Width Pulse Generator," issued on Mar. 20, 2001, both of which are assigned to the assignee of the present invention. Other types of clock generator circuits that provide a pulsed clock signal meeting the below-described characteristics are within the scope of various embodiments.

With continuing reference to FIG. 2, the atomic reset circuit 225 includes a p-type field effect transistor (PFET) reset or precharge device 235 having one terminal coupled to a power supply and another terminal coupled to a domino node 237 at an output of the n-type domino logic 210. Also coupled to the domino node 237 is a series of three inverters 240, 241 and 242. An output of the first inverter 240 is coupled to one input of a NAND gate 245 while a second input of the NAND gate 245 is coupled to receive an output of the third inverter 242. An output of the NAND gate 245 is coupled to the gate of the reset device 235 to control its operation. The atomic reset circuit 225 also includes a weak sustainer PFET device 247 having one terminal coupled to the power supply, a second terminal coupled to the domino node 237 and a gate coupled to an output of the first inverter 240.

While the embodiment of FIG. 2 includes atomic reset circuitry 225 such that the pulsed domino flip-flop 215 is self-resetting, for another embodiment, the reset circuitry 125 (FIG. 1) may include global reset circuitry. Where global reset circuitry is used, the global reset circuitry may include circuitry as simple as a series-coupled chain of inverters having an input coupled to receive the Ck signal from the pulsed clock generator 105 and an output coupled to one input of a NAND gate such as the NAND gate 245. Alternatively, for one embodiment, the global reset circuitry may be similar in structure and functionality to the global reset circuitry described in copending U.S. patent application Ser. No. 09/608,389, entitled, "A Global Clock Self-Timed Circuit with Self-Terminating Precharge for High Frequency Applications," filed concurrently herewith and assigned to the assignee of the present invention. Both examples of atomic and global reset circuits are self-timed circuits.

With continuing reference to FIG. 2, the set dominant latch portion 220 of the pulsed, self-resetting domino circuit 215 of one embodiment includes an n-interrupted inverter formed by a PFET device 250 and an NFET device 255. An input to the n-interrupted inverter is coupled to the domino node 237 while an output of the n-interrupted inverter is coupled to one terminal of a PFET pull-up device 260 and to an input of an inverter 265. The other terminal of the pull-up device 260 is coupled to the power supply. An output of the inverter 265 is coupled to the gate of the pull-up device 260 and to the gate of a first NFET pull-down device 270. The NFET pull-down device 270 has one terminal coupled to ground and a second terminal coupled to a terminal of the NFET device 255. A second NFET pull-down device 275 is coupled in parallel with the first NFET pull-down device 270.

The N-type domino logic 210 may be any type of domino logic gate that implements any one of a variety of logic functions. The n-type domino logic 210 may, for example, perform a NAND logic function according to input data received at inputs 211a and 211b and provide a corresponding logical output at the domino node 237 during an evaluate pulse as described in more detail below. Alternatively, domino logic 210 may perform a different type of logical function and/or may include a different number of inputs to receive input data.

In operation, during a reset (or precharge) pulse, the domino node 237 is precharged to a logic high level by the precharge device 235. During a subsequent evaluate pulse, depending on the data received at the data inputs 211 and the logical function performed by the domino logic 210, the domino node 237 may be discharged to a logic low level or it may remain at the precharged logic high voltage level. The timing and widths of the precharge and evaluate pulses for one embodiment is determined, at least in part, by the atomic reset stage 225 as described in more detail below.

On a rising edge of the Ck pulse for this embodiment, the evaluate device 213 is turned on such that a path to ground is provided for the domino logic 210. Assuming the domino node 237 was previously precharged high, and data on the domino logic inputs 211 causes the domino logic 210 to evaluate low, the domino node 237 begins to discharge to a logic low level.

As the domino node 237 discharges, an output of the first inverter 240 of the atomic reset stage 225 begins to rise causing a logic high value at one input to the NAND gate 245 and disabling the pull-up device 247. The other input to the NAND gate 245, however, is still at a logic low level at this time based on the precharged high level of the domino node 237. As the output of the inverter 240 transitions to a logic high value, the output of the second inverter 241 falls and the output of the third inverter 242 rises causing the second input to the NAND gate 245 to transition to a logic high level two inversions later. When both inputs to the NAND gate 245 are high, the output of the NAND gate 245 transitions to a logic low level and the precharge device 235 is turned on. Turning on the precharge device 235 initiates a reset pulse during which the domino node 237 is again pulled to a logic high level.

In this manner, the flip-flop 215 is self-resetting. As described above, for the flip-flop 215, from the time the domino node 237 discharges to a low enough level to cause a logic transition to the time the domino node charges high is five inversions (also referred to as unit delays or gate delays). Thus, the evaluate pulse width is substantially equal to five inversions.

Once the reset pulse is initiated, as the domino node 237 is pulled high, the output of the inverter 240 falls and causes an input to the NAND gate 245 to fall. As the input to the NAND gate 245 goes low, its output rises such that the precharge device 235 is disabled, thereby ending the reset pulse. In this manner, the reset input pulse at the gate of the device 235 is clipped by the NAND gate 245 to have a pulse width substantially equal to 3 inversions. Thus, using the atomic reset loop 225, predictable reset and evaluate pulse widths are enabled for each cycle of the pulsed clock Ck.

For other embodiments, a different atomic reset loop structure may be used to provide different evaluate and/or reset pulse widths depending on requirements of the particular circuit topology and goals of the designer. Additional details of an atomic reset loop similar to the atomic reset loop 225 and examples of other types of atomic reset circuits that may be used for various embodiments are provided in U.S. Pat. No. 6,239,621 entitled "Two Legged Reset Controller for Domino Circuit", issued May 29, 2001, assigned to the assignee of the present invention. Other types of atomic reset loops are within the scope of various embodiments.

Concurrently with the above operations, the set dominant latch 220 portion of the pulsed domino flip-flop 215 is activated by a Ck signal pulse received at the pulldown device 275 such that a reset of the pulsed domino flip-flop is triggered for each cycle of the clock signal Ck. The latch 220 latches an inverse of a value indicated by the domino logic 210 during an evaluate pulse in response to input data on input(s) 211, thereby sustaining a data level that is rippled through the static logic stages 230a–230d to an output 266 for use by downstream logic. In this manner, the latch 220 provides a static signal from a pulsed input signal and acts as an interface between pulsed and static environments.

On a rising edge of the Ck signal, because the node 237 is precharged high, the device 255 is enabled and an output 267 of the latch 220 begins to be pulled low (i.e. reset). If, during the evaluate pulse, data on the inputs 211 to the domino logic 210 is such that the domino logic 210 does not discharge the domino node 237, the node 237 maintains its precharged high level and the latch 220 appropriately indicates the inverse of that level.

If, however, the inputs 211 to the domino logic 210 are set such that the domino logic 210 evaluates low, the reset of the latch 220 will be overridden. A reset of the latch 220 is started upon receiving the Ck signal pulse because the node 237 has been precharged high. As the domino node 237 is pulled low, however, in the middle of the reset, the device 275 is disabled by the falling edge of the Ck signal pulse. The pullup device 250 (and the weak sustainer device 260, two inversions later) is then enabled in response to a logic low voltage level at the domino node 237 such that the output 267 of the latch 220 is pulled to a logic high value. As the output 267 of the latch 220 is being set due to the domino node 237 being discharged, a self-reset pulse is being initiated by the atomic reset loop 225 causing a voltage at the node 237 to again be pulled higher.

For most latches, both input data hold high and hold low constraints are suppression race conditions, i.e. erroneous data may be latched if either of the hold times are not met. For the pulsed, self-resetting domino flip-flop 215 of FIG. 2, however, the input data hold high constraint is an easier to meet generation race condition. In this manner, the flip-flop 215 is easier for designers to work with, particularly in a high-frequency environment. If a high to low transition on the data at the inputs 211 occurs early (i.e. before the end of the evaluate pulse), the domino stage 210 is not false fired, it is just turned off. The early transition merely acts to reduce the overlap between the pulsed clock signal Ck and the data signal. It is desirable, however, for the data to stay high long enough so overlap between the pulsed clock signal Ck and the input data is sufficient to pull the domino node 137 low.

The input data hold low constraint is a suppression race condition. If a low to high transition on the data at the inputs 211 occurs early, the domino stage 210 may be false-fired potentially causing the latch 220 to latch erroneous data. Thus, low input data should be held low until the end of the Ck pulse.

Other input constraints include setup high and setup low data constraints (both speedpaths) which are discussed in detail below in reference to FIG. 4.

Other constraints within the pulsed, self-resetting domino flip-flop 215 include lead gap (speedpath) and trail gap (power race) constraints. For the lead gap constraint, if the end of a reset pulse overlaps with the beginning of the next evaluate pulse (initiated by the rising edge of the Ck signal), both pull-up and pull-down paths may be turned on during the overlap. Thus, a reset pulse should end before the next evaluate pulse begins in order to avoid power contention. The trail gap constraint refers to the time between the end of the Ck signal pulse to the beginning of the reset pulse. It is desirable for the Ck signal pulse to end before the reset pulse begins to avoid power contention caused by enabling the pull-up path while the pull-down path is still enabled.

In accordance with a latch race constraint, the Ck signal pulse at the pull-down 275 should end before the evaluate pulse ends or the output of the latch 220 may be glitched in the wrong direction.

Additionally, in order to provide for proper operation of the circuit 200, the clock signal Ck pulse should be wide enough such that the domino node 237 can be fully or mostly discharged while the Ck signal is high and so that the node 267 can be reset. The reset pulse should be wide enough to adequately precharge the node 237. Since the atomic reset loop 225 is a self-timed circuit, the pulses around the loop should also be wide enough such that other nodes within the loop 225 can switch in the time needed for the circuit to operate properly. Additionally, the evaluate pulse width (the data pulse at the domino node 237) should be wide enough such that the output of the latch 220 can be set during the evaluate pulse. Other design constraints may exist for this and other embodiments.

The controlled 5-inversion evaluate pulse width and shorter 3-inversion reset pulse width provided by the atomic reset loop 225 help to provide appropriate margin such that the above-described race conditions are more easily met, while still enabling the circuit 200 to operate at very high frequencies. The 5-inversion evaluate pulse width provides additional margin against the harder to meet functional race condition associated with setting the latch 220 output and helps to ensure that the node 237 can be fully discharged during an evaluate pulse and that low data can be latched during a pulse of the Ck clock signal. The shorter 3-inversion reset pulse width is sufficient for the easier to meet race condition between the reset pulse and the Ck signal cycle time.

Further, the width of the clock signal Ck pulse may be controlled by the pulsed clock generator 205 to provide a predetermined minimum width sufficient to discharge the domino node 237 to the extent necessary for the latch 220 to latch correct data.

With continuing reference to FIG. 2, the pulsed, self-resetting domino flip-flop 215, as described above, provides a clean domino characteristic that is useful for downstream logic (i.e. evaluate and reset pulse widths are tightly controlled and can be independently timed). Further, as compared to conventional flip-flops, one of the hold constraints of the flip-flop 215 is easier to meet and time borrowing is enabled for one of the setup constraints.

The pulsed domino flip-flop 215 of one embodiment uses only a true form of the clock signal (i.e. the flip-flop 215 does not also use a complementary form of the clock signal as for a conventional latch), such that an additional inverter or other additional clock circuitry is not needed. By using a pulsed clock signal and presenting only a single FET clock load, clock load and clock power may be reduced over other flip-flop implementations.

Under ideal or near ideal conditions, with the 5-inversion evaluate pulse width and 3-inversion reset pulse width provided by the atomic reset loop 225, a clock cycle can be as small as 8 inversions such that very high frequency operation can be achieved. Even under less than ideal conditions where the cycle time is slightly greater, it is possible to operate the circuit 200 at a very high frequency. For one embodiment, for example, the input MCk signal may be a 1.4 GHz signal, for example, such that the Ck signal is effectively 2.8 GHz. In this manner, using the pulsed circuit topology of some embodiments, it may be possible, for example, to run particular areas of a microprocessor or other high frequency integrated circuit device at a multiple of the speed of the rest of the device. It will be appreciated that these frequencies are only provided for purposes of example and that other frequency relationships between the MCk and Ck signal are within the scope of various embodiments.

For other embodiments, the set-dominant latch 220 may be configured in a different manner. For example, for one embodiment, an additional inverter is cross-coupled with the inverter 265 to form a jam latch and the pull-up device 260 is removed. Further, the set-dominant latch of some embodiments may include additional logic circuitry to perform a desired logic function. Other types of latches are within the scope of various embodiments.

Figure 3:
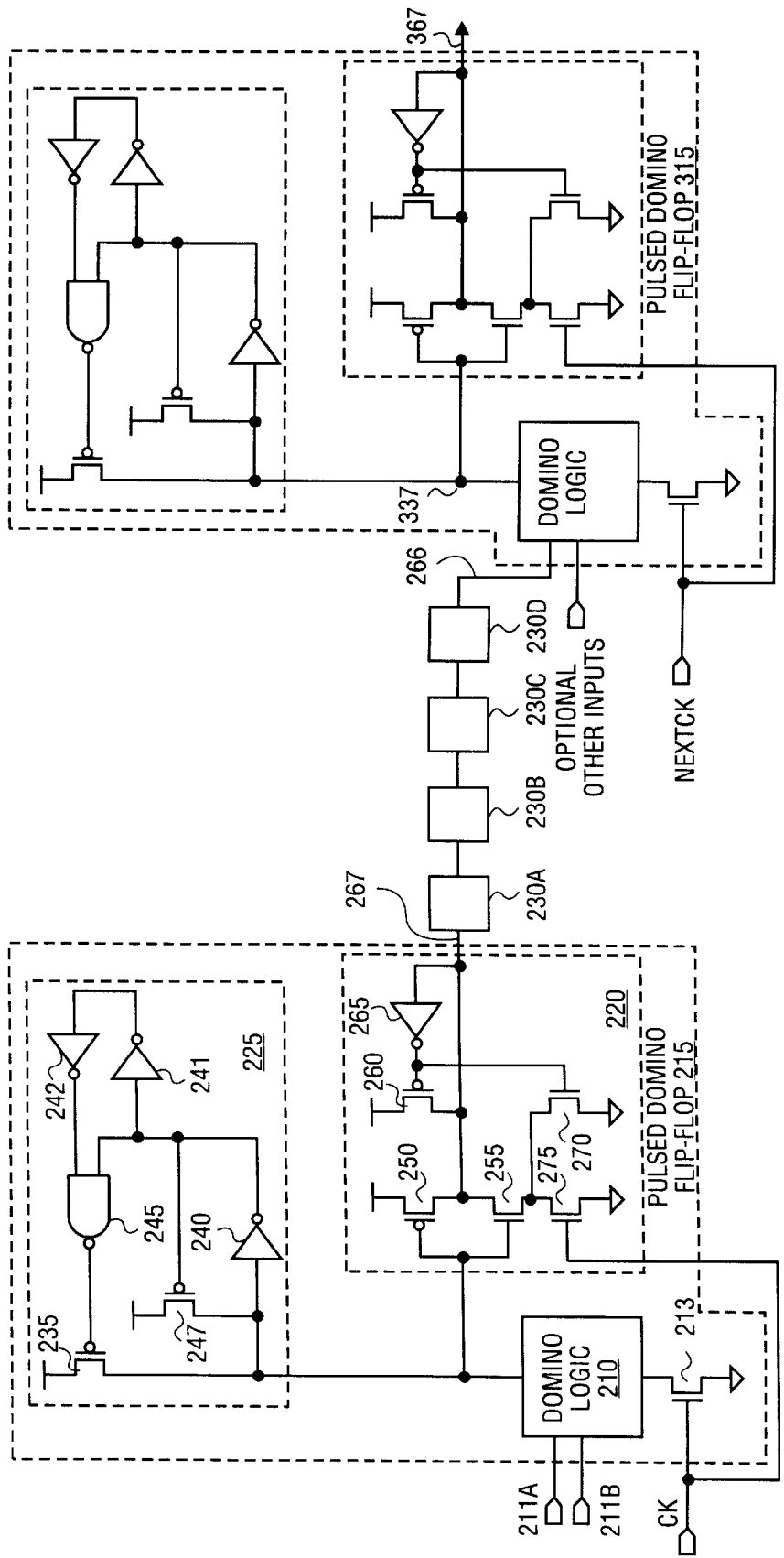
FIG. 3 is a schematic diagram of the circuit of FIG. 2 coupled to a subsequent pipestage.

Referring now to FIG. 3 the circuit 200 may be coupled to a next pipestage, such as, for example, another pipestage similar to the pipestage of FIG. 2. For such a case, the output 266 of the circuit 200 may be coupled to an input of a pulsed domino flip-flop 315 of the next pipestage, for example. The pulsed clock signal received at the next pipestage (referred to herein at NextCk) may also be generated by the pulsed clock generator 205 (shown in FIG. 2) and provided to the next pipestage through a clock distribution network (not shown). Alternatively, the NextCk signal may be provided by a different pulsed clock signal source that may be similar to or different from the pulsed clock generator 205.

When interfacing to a subsequent pipestage, there are four constraints associated with the interface: two speedpaths and two race conditions. The two race conditions, hold high and hold low (also referred to as minimum delay or min-delay race conditions), are discussed above with reference to the circuit 200. The two speedpaths are referred to as setup high and setup low constraints.

Under ideal conditions, it is desirable for data to ripple through the entire pipestage (i.e. to the output 266) before the next clock pulse arrives. For the setup high constraint, if the rising data edge arrives slightly late at the input 337 to the next flip-flop 315, the pulsed, domino flip-flop 315 (which may be similar in configuration and functionality to the flip-flop 215) can still be activated. The late-arriving data just reduces the overlap between the NextCk signal and the signal at the output 367 of the flip-flop 315, but the output node 367 can still be discharged most of the way. In this manner, the pulsed, domino flip-flop 215 described herein enables time borrowing.

For the setup low constraint, however, if the falling data edge arrives late such that it is not setup before the next rising edge of the NextCk signal, the domino flip-flop 315 of the next stage may potentially false fire and latch incorrect data. There can be a very small amount of overlap between the falling edge of the data signal and the rising edge of the NextCk signal, but the larger the overlap, the more noise that is injected. These setup high/low constraints also apply to the input(s) of the pulsed domino flip-flop 215.

In the circuit of FIG. 3, there are four static logic stages 230a–d between the first pulsed domino flip-flop 215 and the second pulsed domino flip-flop 315 (a different number of static logic stages may be provided for other embodiments). For one embodiment, each of the static logic stages 230a–d is an inverting logic stage. With an even number of inversions between the output 267 of the first pipestage and the input 337 of the next pipestage, the low active signal with the tighter setup constraint actually arrives at the flip-flop 315 one inversion earlier than the high active signal due to the manner in which the latch 220 operates. For the circuit of FIG. 3, for example, the low active signal (transitioning from high to low) arrives at the node 337 in 5 inversions while the high active signal arrives at the node 337 in 6 inversions. (The number of inversions is counted from the time the Ck signal edge is received at the gate of the device 275 to the time the responsive signal is received at the node 337). This provides one additional inversion of margin against the setup low constraint described above.

If, however, a complement of the output signal 267 from the pulsed domino flip-flop 215 is instead desired to be communicated to the flip-flop 315, there may be an issue. If the complementary signal is simply tapped from the signal line between the static logic stage 230c and the static logic stage 230d, a signal transition from high to low will actually arrive at the node 337 one inversion earlier than a signal transition from low to high. In this manner, the constraint that is harder to meet has even less margin.

For one embodiment, to address this issue, receiver-side interface circuitry is added. Referring to FIG. 4, for one embodiment, an edge shifter circuit, such as the edge shifter circuit 405 is added to provide the desired complementary signal. For purposes of simplicity, the subsequent pipestage is not shown in FIG. 4.

Figure 4:
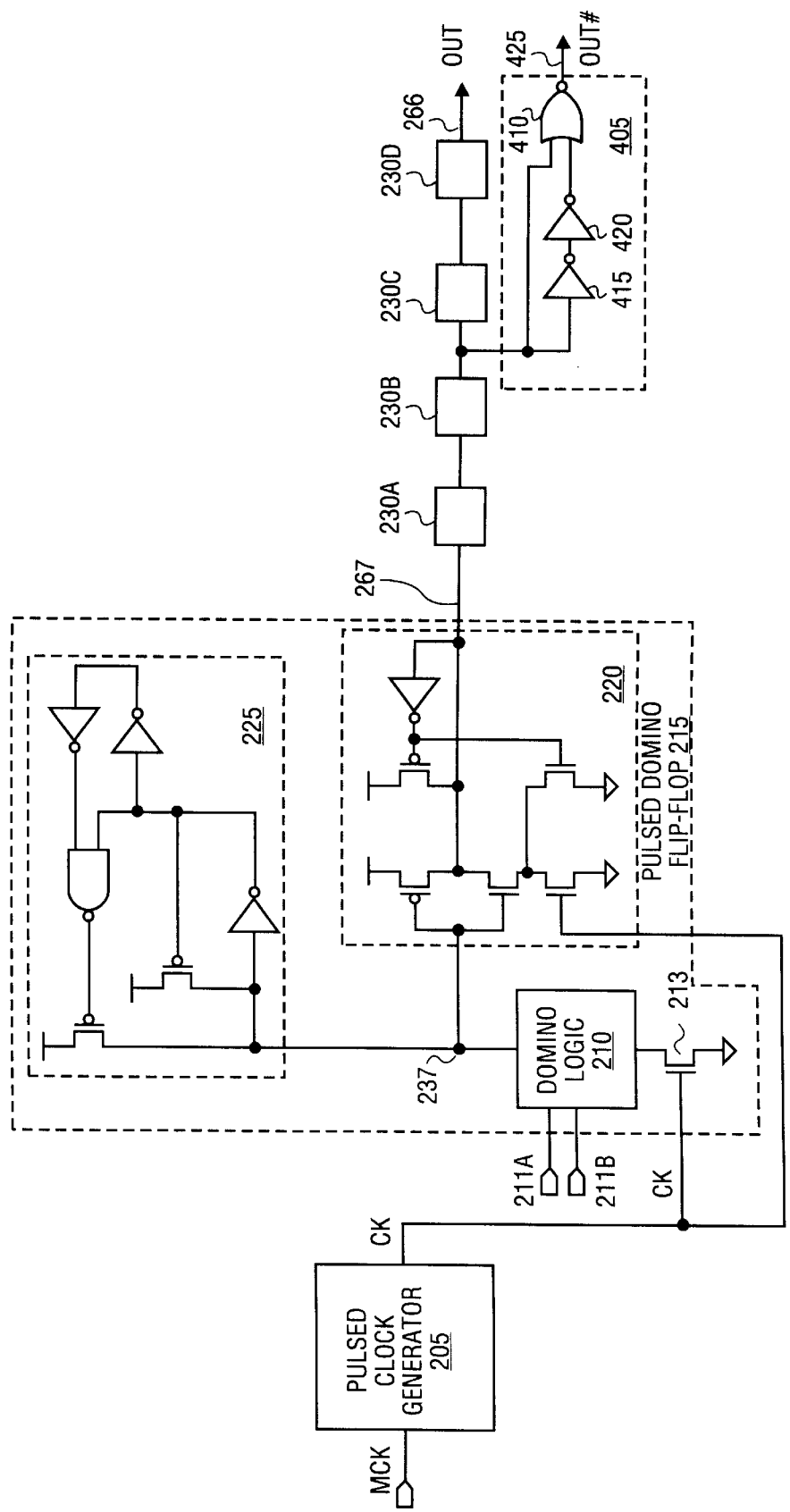
FIG. 4 is a schematic diagram of the pulsed circuit topology of one embodiment further including an edge-shifter circuit of one embodiment.

The edge shifter circuit 405 of FIG. 4 incldes a NOR gate 410 having one input coupled to an output of the static logic stage 130b such that it receives the true form of the output signal from the flip-flop 215 delayed by two inversions. The other input to the NOR gate 410 is coupled to two series-coupled inverters 415 and 420 such that it receives the true form of the output signal from the flip-flop 215 delayed by an additional two inversions. The NOR gate 410 provides a complementary form of the flip-flop 215 output signal (OUT#) at the output node 425. Thus, when coupling the circuit of FIG. 4 to a subsequent pipestage as shown in FIG. 3, the output node 266 or the output node 425 may be coupled to the input node 337.

In operation, when the output signal from the flip-flop 215 is low, both inputs to the NOR gate 410 are low such that the output of the NOR gate is high. As the signal at the output node 167 of the flip-flop 215 transitions from low to high, the transition ripples through the static stages 230a and 230b to the input of the NOR gate 410 that does not include the inverters 415 and 420 in its path. As soon as the logic high input is received at the NOR gate 410, the output of the NOR gate 410 transitions to a logic 0 value to provide a complementary signal. In this manner, a Ck signal edge received at the pulsed domino flip-flop 215 that causes a low to high transition at the node 267, causes a high to low transition at the output node 425 five inversions after the Ck signal edge is received.

In contrast, as the output node 267 transitions from a high logic state to a low logic state in response to a transition of the Ck signal, the logic low value is rippled through the static stages 230a and 230b to the NOR gate 410 input that does not include the inverters 415 and 420 in its path. Due to the logical operation of the NOR gate 410, however, the output of the NOR gate does not transition from a logic low state to a logic high state until two inversions later when the other NOR gate 410 input transitions from high to low. In this manner, a Ck signal edge received at the flip-flop 215 that causes a high to low transition at the node 267 results in a signal that arrives at the output node 425, and thus, at the input node 337 of the next pipestage (FIG. 3), 6 inversions later.

Thus, using the edge shifter 405, an extra inversion of margin is provided for min-delay race protection while the transition associated with the harder to meet setup time (setup low) arrives one inversion earlier.

Figure 5:
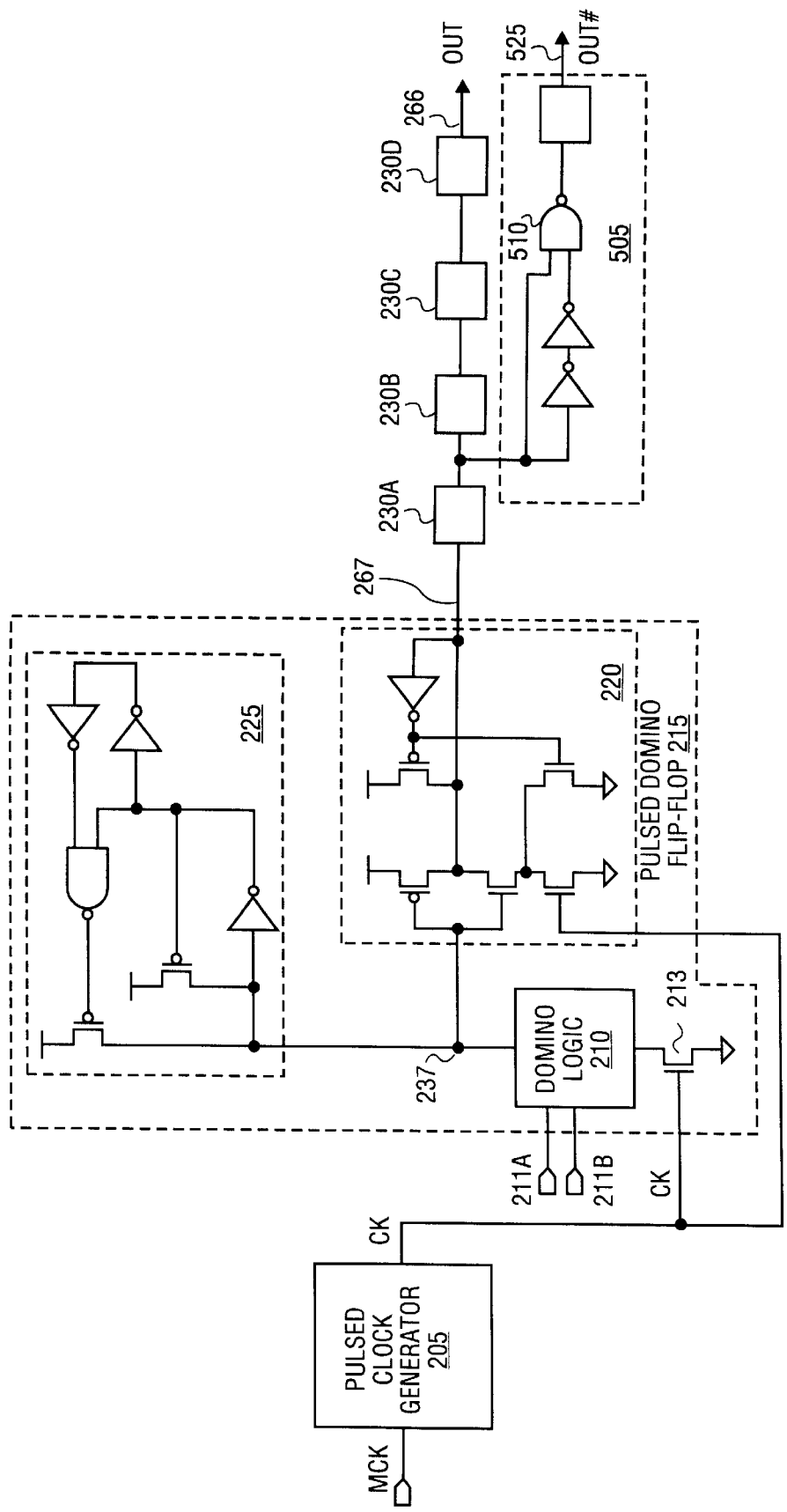
FIG. 5 is a schematic diagram of the pulsed circuit topology of one embodiment including an edge-shifter circuit of an alternate embodiment.

Other types of edge shifters may also be used for various embodiments to provide similarly advantageous results. Referring to FIG. 5, another type of edge shifter 505 is shown. The edge shifter 505 includes a NAND gate 510 instead of a NOR gate and is coupled to the circuit at an output of the first static logic stage 230a. In a similar manner to the edge shifter 405 of FIG. 4, the edge shifter 505 provides for a signal indicating a low to high transition of the domino node 237 to be reflected in the OUT# signal at the output node 525 six inversions later. A high to low transition of the node 237 arrives at the output node 525 five inversions later.

FIGS. 6A–6D show some examples of other types of edge shifters that may be used in accordance with various embodiments.

Figure 6A:
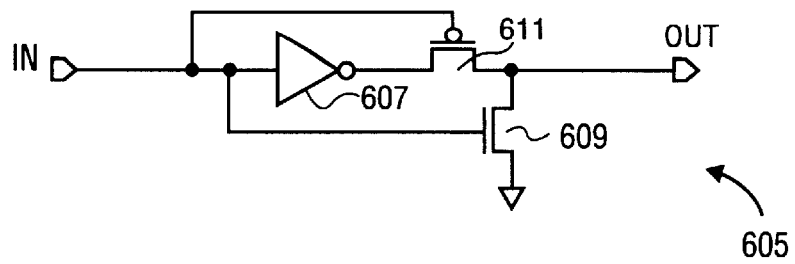
FIGS. 6A–6D are schematic diagrams of edge shifters that may be used for alternative embodiments.

FIG. 6A shows an edge shifter 605 including an inverter 607, an n-type transistor 609, and a p-type shifter transistor 611 that may be used to shift a rising edge at the output of the edge shifter 605. An input to the inverter 607 and the gates of the transistors 609 and 611 are each coupled to an input to the edge shifter. The source of the n-type transistor 609 is coupled to ground and its drain is coupled to the edge shifter 605 output. The source of the shifter transistor 611 is coupled to an output of the inverter 607 and its drain is coupled to the edge shifter 605 output.

In operation, the edge shifter 605 uses the high threshold created by the body effect of a transistor to create a delay element. As a signal received by the edge shifter 605 input transitions from low to high, the pull-down transistor 609 is enabled to pull the output of the edge shifter 605 low. Thus, there is one inversion of delay between the edge shifter 605 input signal and the output signal for a falling edge transition on the output.

As a signal received by the edge shifter 605 input transitions from high to low, an output of the inverter begins to transition the source of the switching transistor 611 from a low to high level. Prior to this transition, both the source and drain of the switching transistor 611 are at a logic low level (approximately 0 volts). As the voltage at the switching transistor 611 source increases in response to the signal transition, no current flows through the switching transistor 611 until the source voltage reaches a threshold voltage that is higher than the voltage level of the gate.

This threshold voltage is magnified in proportion to the square root of the difference between the voltage at the transistor 611 source and the n-well voltage of the transistor due to the configuration of the circuit 605. This higher threshold voltage causes the shifter transistor 611 to act as a delay element to further delay a rising edge transition at the edge shifter 605 output. The delay between the edge shifter input and output for a rising edge transition at the edge shifter 605 output, however, is in the range of approximately 1.2 to 2 inversions. Thus, using the edge shifter of FIG. 6A, it may be possible to have a smaller range of differences between the rising and falling edge transitions available to a designer.

Where it is desirable to shift a falling edge transition, the edge shifter 615 may instead be used. The edge shifter 615 includes an n-type shifter transistor 617, a p-type transistor 619 and an inverter 621. The edge shifter 615 operates in a similar (but complementary) manner to the edge shifter 605 to shift a falling edge transition at the output of the edge shifter 615.

Figure 6B:
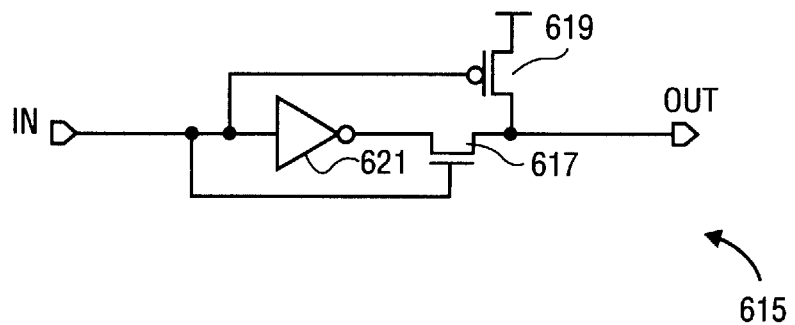

For either of the edge shifters 605 or 615 of FIGS. 6A and 6B, respectively, a capacitor may be added between the inverter 607 or 621 and the source of the respective shifter transistor 611 or 617 with one terminal of the capacitor being tied to ground. The addition of the capacitor may provide additional control over the turn on time of the shifter transistor 611 or 617. This may be particularly useful in the case of the edge shifter 615 where the delay provided by the n-type shifter transistor 617 may be smaller than the delay provided by the p-type shifter transistor 611.

As compared to conventional edge shifters, the edge shifters of FIGS. 6A and 6B provide additional fine tuning range for edge shifting purposes. Further, because they can be implemented using fewer transistors, they may save space and power.

Figure 6C:
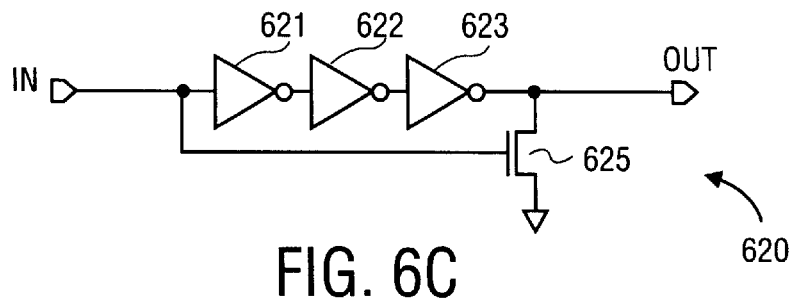

FIG. 6C shows another type of edge shifter 620 that may be used for some embodiments. The edge shifter 620 of FIG. 6C includes three inverters 621–623 coupled in series between the edge shifter 620 input and output. The edge shifter 620 further includes an n-type transistor 625 having a drain coupled to the output of the edge shifter, a source coupled to ground and a gate coupled to the edge shifter 620 input.

In operation, a low to high signal transition received at the input of the edge shifter 620 enables the transistor 625 such that it pulls down the output of the edge shifter 620 one inversion later. Concurrently, the inverter 621 receives the signal transition. The output of the third inverter 623, however, has not transitioned due to the delay caused by the series of inverters and thus, if the third inverter 623 were a conventional inverter, it would be contending with the pull-down device 625. For the edge shifter 620, however, the pull-up device of the inverter 623 is sized relative to the pull-down device 625 such that the pull-down device 625 always controls when they are both enabled. In this manner, a low to high signal transition at the edge shifter 620 input causes a high to low signal transition at the edge shifter 620 output one inversion later while a transition in the other direction is delayed by three inversions through the inverter chain.

Figure 6D:
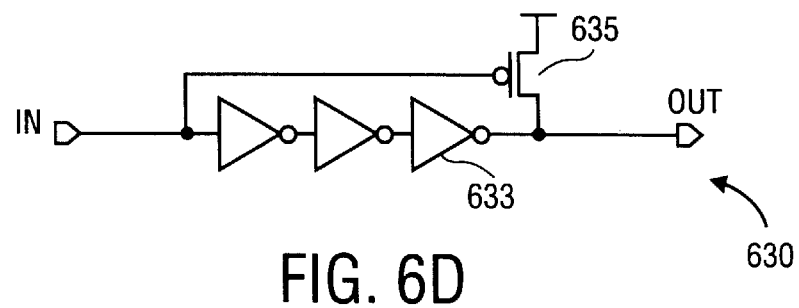

The edge shifter 630 of FIG. 6D operates in a similar manner to the edge shifter 620 to delay a falling signal transition at the edge shifter 630 output. For the edge shifter 630, however, the pull-down device of the third inverter is sized relative to the pull-up device 635 such that the pull-up device 635 always controls when they are both enabled.

The relative sizing of the p- and n-type devices described above may be accomplished using simulation techniques, for example. For other embodiments, a different number of inverters may be included between the edge shifter input and output to provide different relative delays.

The edge shifters of FIGS. 6C and 6D use a smaller number of transistors as compared to conventional edge shifters that perform a similar function, and thus, may save space.

Other types and placements of edge shifters are within the scope of various embodiments. For example, an edge shifter similar to the edge shifters 405, 505 or one of the edge shifters shown in FIGS. 6A–6D may be coupled at a different point in the chain of static logic stages. Where there are more than four static logic stages, either edge shifter may be placed in a different location or include a different number of static logic stages at its output so long as the configuration provides a desirable relationship between the low to high and high to low transitions (e.g. 6/5, 8/7, etc.) Other types of circuits that shift the different types of transitions by different amounts may be used for various embodiments.

Where the above-described pulsed circuit topology is being used for longer distance signaling from unit to unit or cluster to cluster, for example, there can be greater discrepancy between clock signals and other signals, and thus, greater uncertainty in terms of meeting constraints. For such implementations, other types of receiver side circuitry may be used to provide enhanced protection from min-delay race failures.

Figure 7:
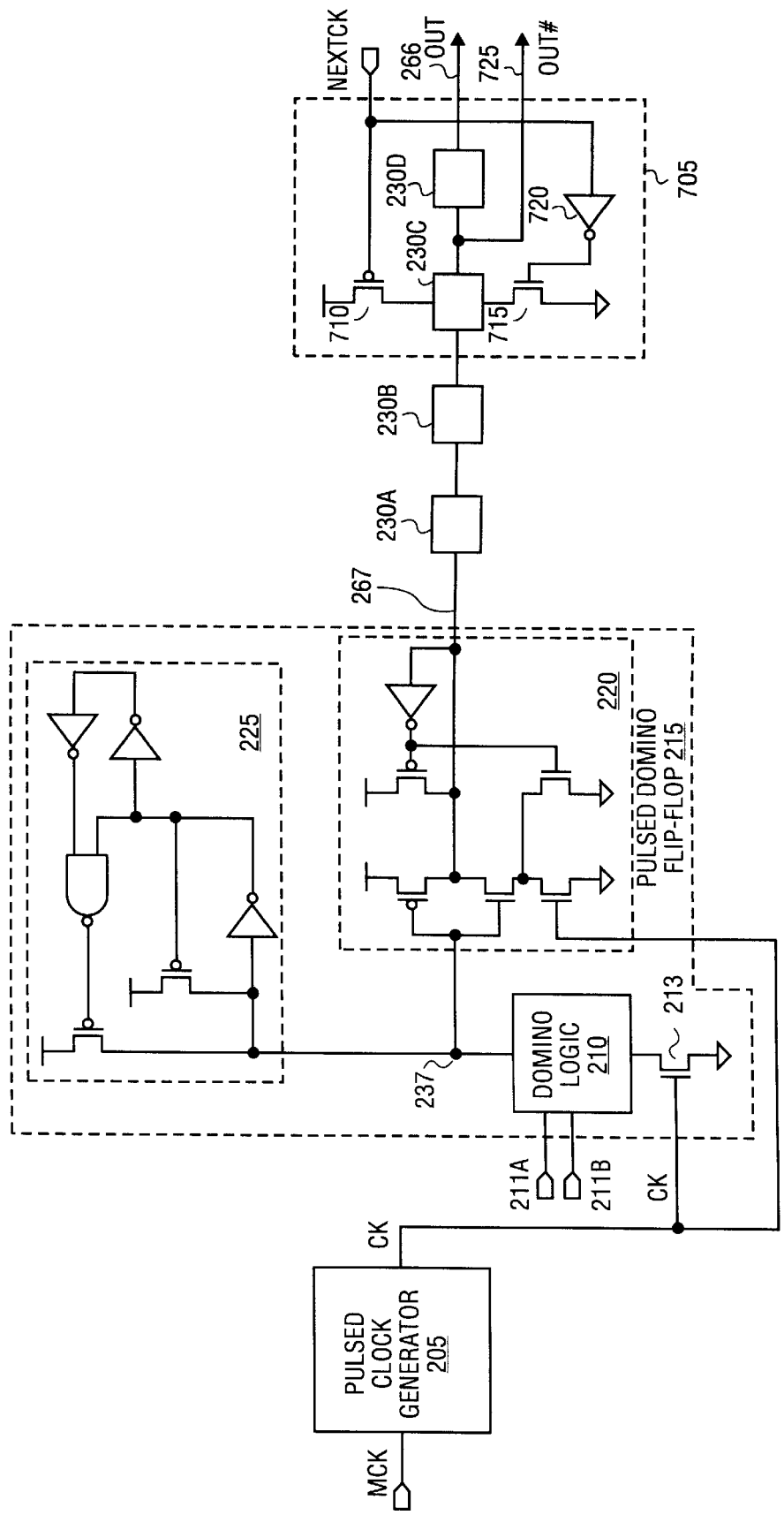
FIG. 7 is a schematic diagram of the pulsed circuit topology of one embodiment including a first type of receiver side full redundant latch.

Referring to FIG. 7, for example, for one embodiment, a redundant latch (also referred to as a dynamic full blocker) such as the redundant latch structure 705 may be used. The redundant latch 705 includes a PFET 710 coupled between the power supply and static logic stage 230c and NFET 715 coupled between the static logic stage 230c and ground. A gate of the PFET 710 is coupled to receive the NextCk signal from the subsequent pipestage (see FIG. 4), while the gate of the NFET 715 is coupled to receive a complementary form of the NextCk signal through an inverter 720. For another embodiment, for noise reasons, the PFET 710 is actually coupled between the pull-up network of the static logic stage 230c and output of the logic stage while the NFET 715 is coupled between the pull-down network of the logic stage 230c and its output. A complementary form of the output signal (OUT#) from the flip-flop 215 is provided at the node 725.

In operation, when the NextCk signal rises activating the domino flip-flop 415 (FIG. 4) or other logic of the next pipestage, both the PFET 710 and the NFET 715 are disabled thereby blocking transmission of the data signal at the static logic gate 230c. Thus, whatever the state of the data signal at the static logic stage 230c, it is held there during the NextCk pulse such that it can be sampled by the next pipestage in either true or complementary form at the output node 266 or 725, respectively. When the NextCk signal pulse ends by transitioning to a low state, the data signal is again allowed to proceed through the logic chain. In this manner, increased min-delay race protection is provided.

For some embodiments, the pulse width of the NextCk signal is narrow enough that a keeper is not needed to recycle the data at the static stage 230c. For other embodiments, a keeper (not shown) may be included to maintain the data at the static logic stage 230c for a longer period of time and/or provide additional protection against noise injection.

It will be appreciated that, in designing with a redundant latch such as the latch 705, timing considerations will include making sure that the next data does not arrive at the redundant latch 705 before the redundant latch is closed. In most cases, this timing constraint is easier to meet than the constraint(s) addressed by the redundant latch 705.

Figure 8:
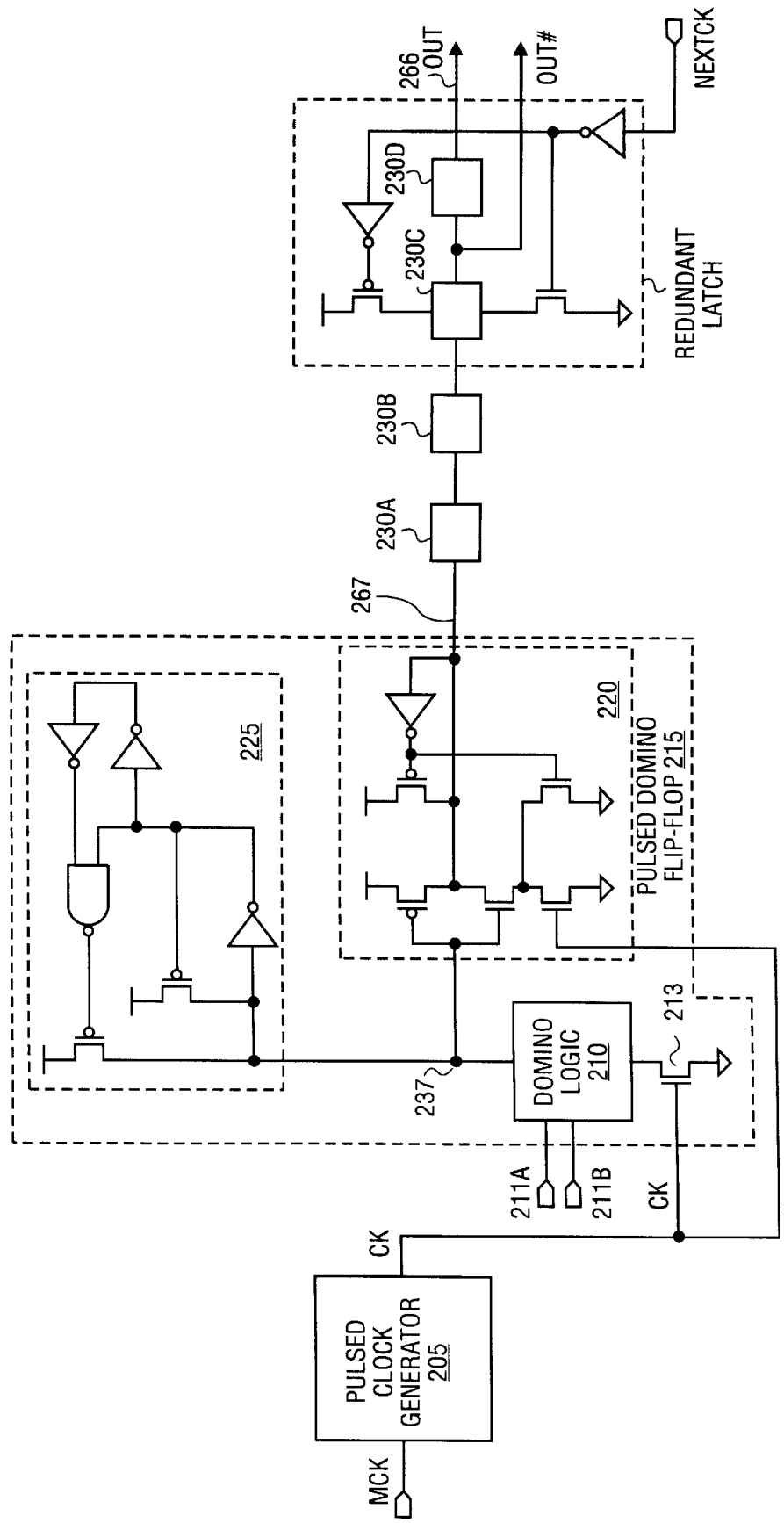
FIG. 8 is a schematic diagram of the pulsed circuit topology of one embodiment including a different configuration of a full redundant latch.
Figure 9:
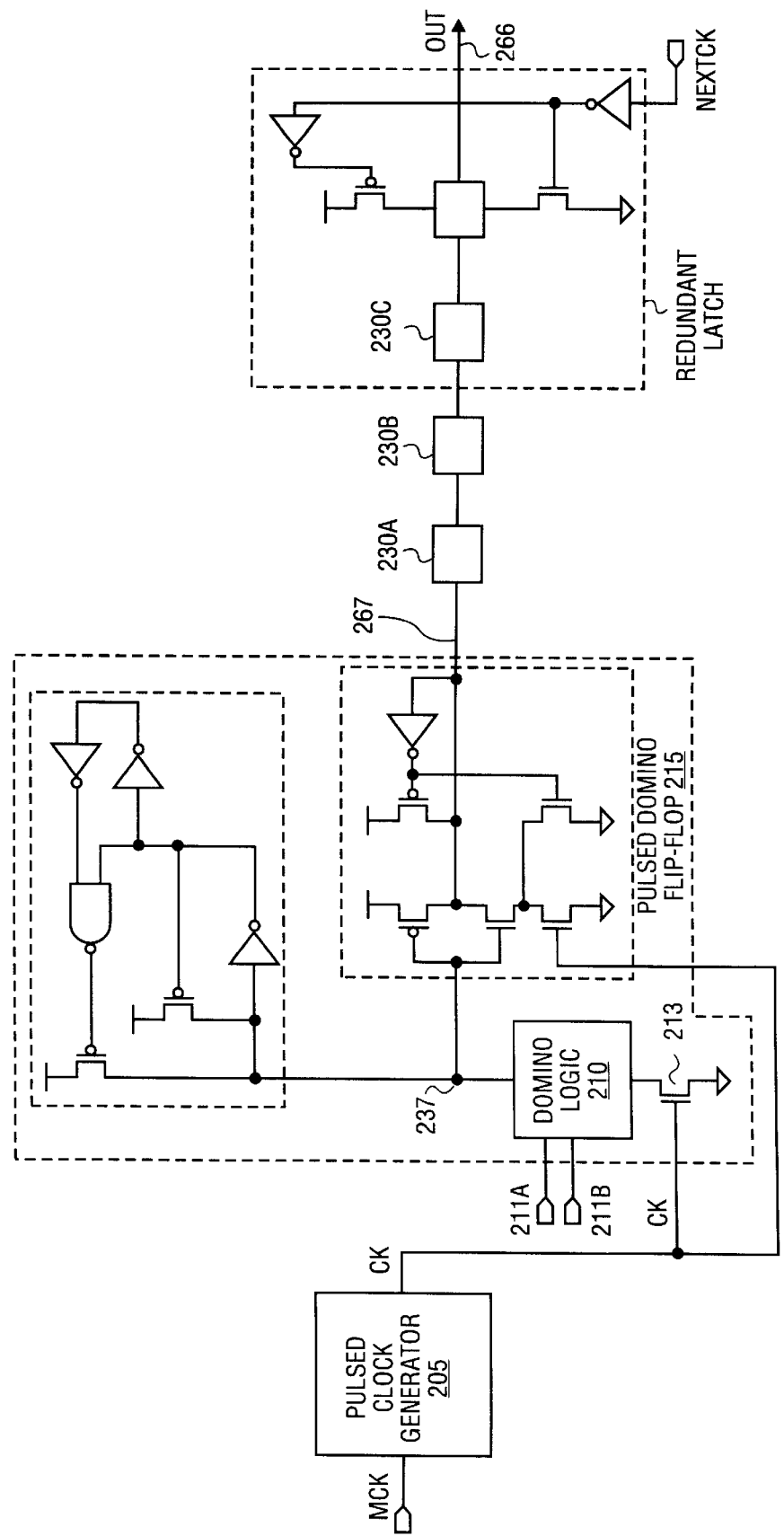
FIG. 9 is a schematic diagram of the pulsed circuit topology of one embodiment including yet another type of full redundant latch.

Other exemplary configurations of a redundant latch using different placement, clocking, and/or coupling approaches that may be used for various embodiments are shown, for example, in FIGS. 8–9. Each different configuration alters the trade-offs between the various constraints depending on whether the PFET or NFET is disabled first, etc. For other embodiments, a different type of redundant latch or full blocker may be used.

Figure 10:
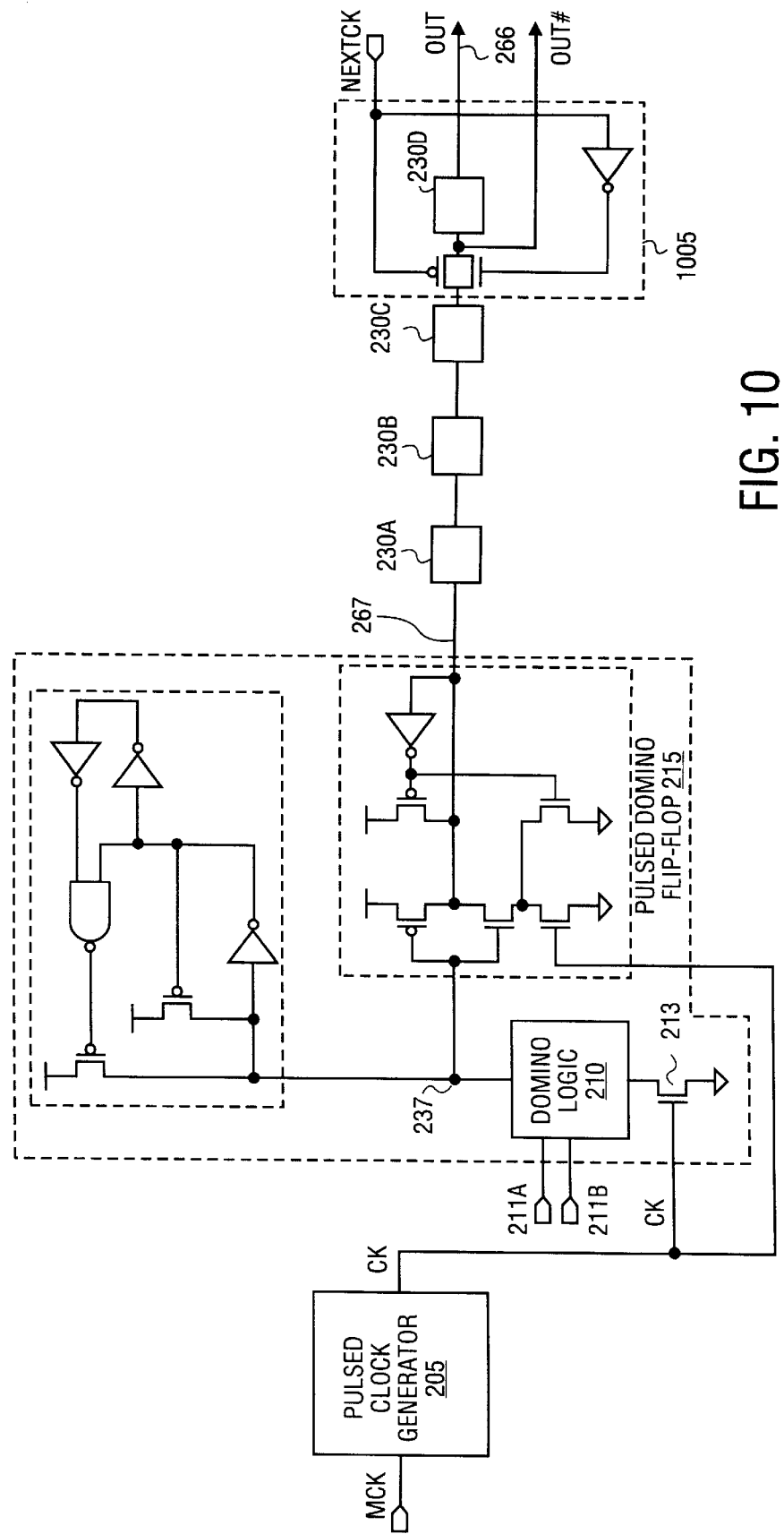
FIG. 10 is a schematic diagram of the pulsed circuit topology of one embodiment including a first passgate blocker circuit configuration used to implement a redundant latch.
Figure 11:
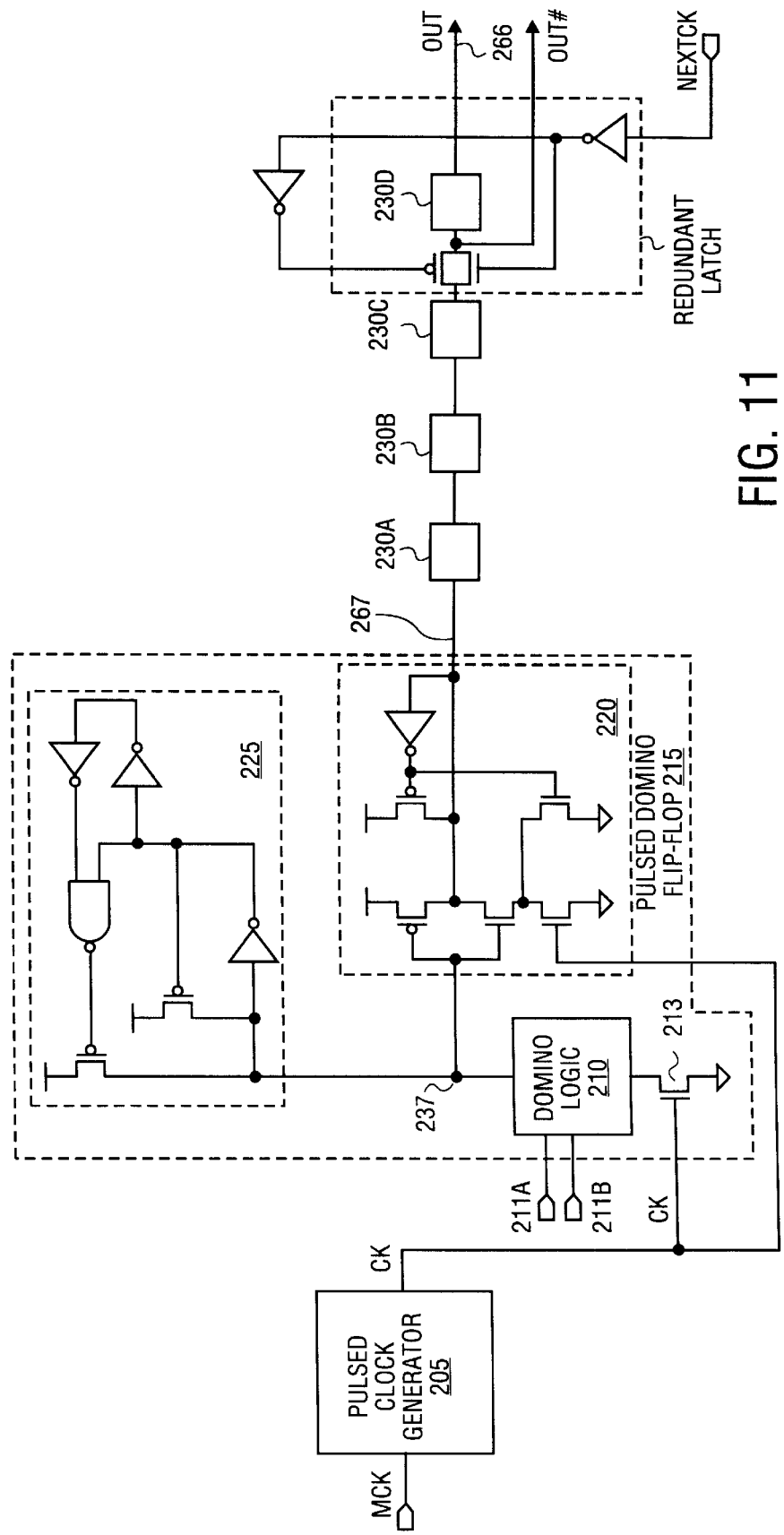
FIG. 11 is a schematic diagram of the pulsed circuit topology of one embodiment including a second passgate blocker circuit configuration with a different clocking approach.
Figure 12:
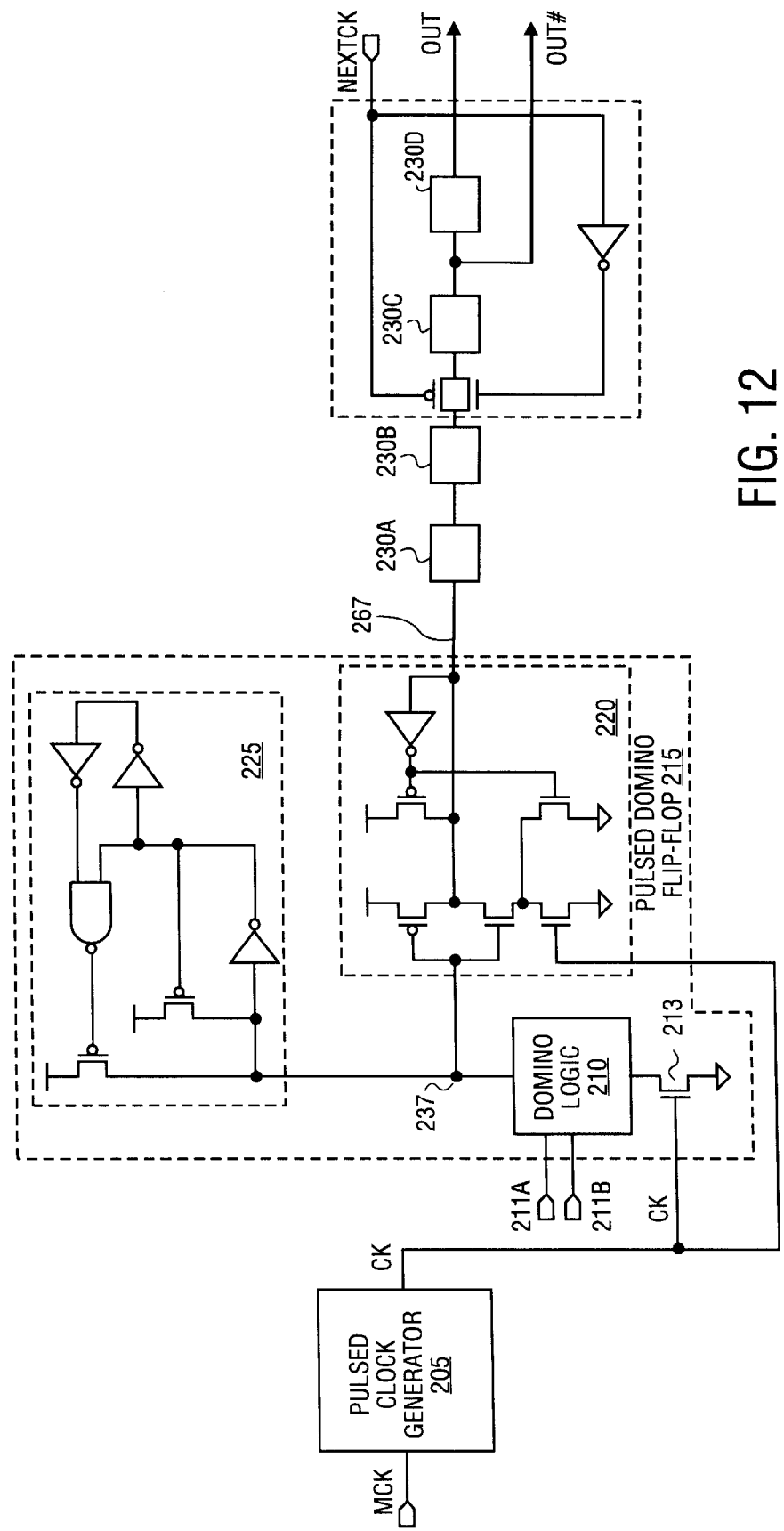
FIG. 12 is a schematic diagram of the pulsed topology of one embodiment including a third passgate blocker circuit configuration.
Figure 13:
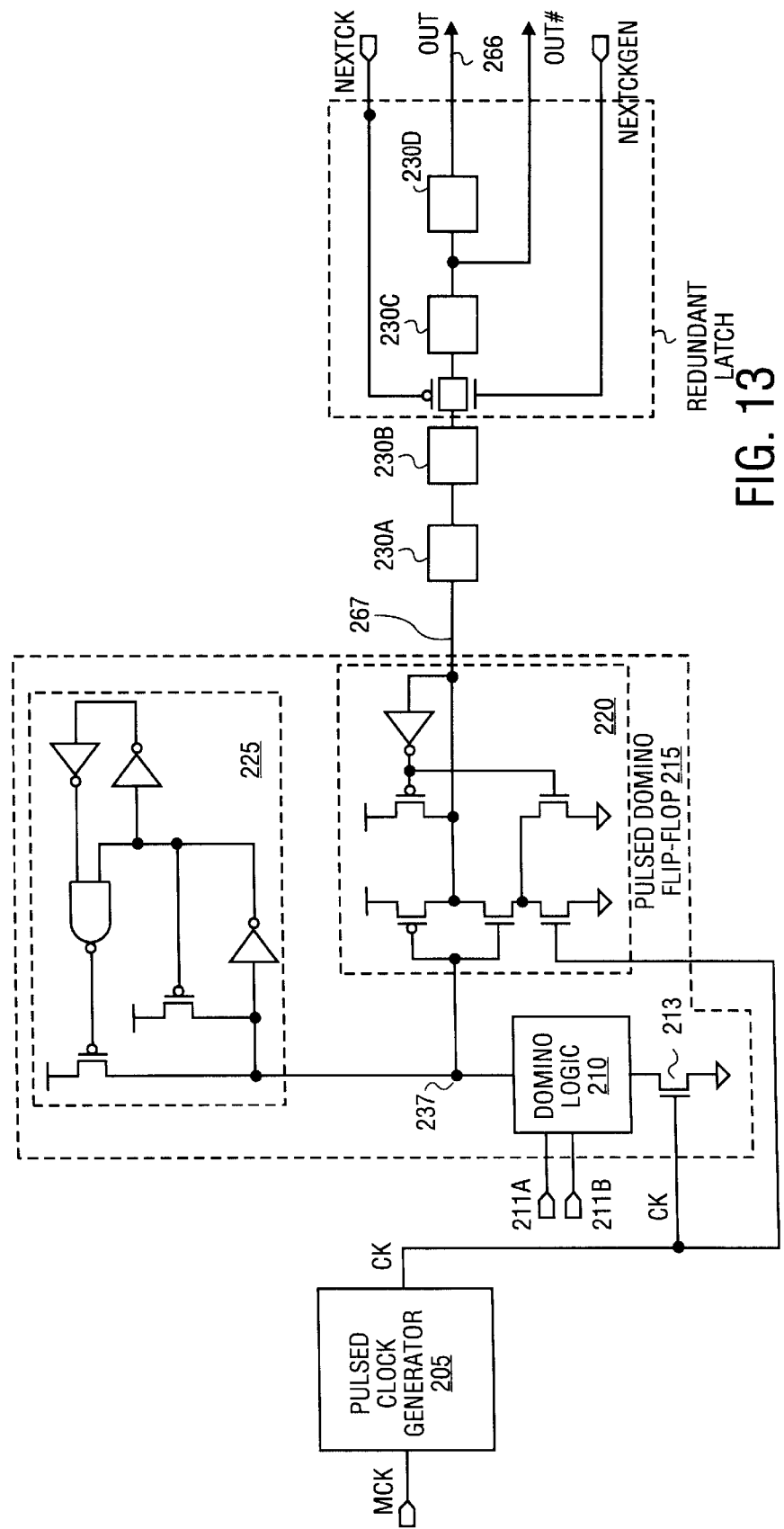
FIG. 13 is a schematic diagram of the pulsed topology of one embodiment including a fourth passgate blocker circuit configuration.
Figure 14:
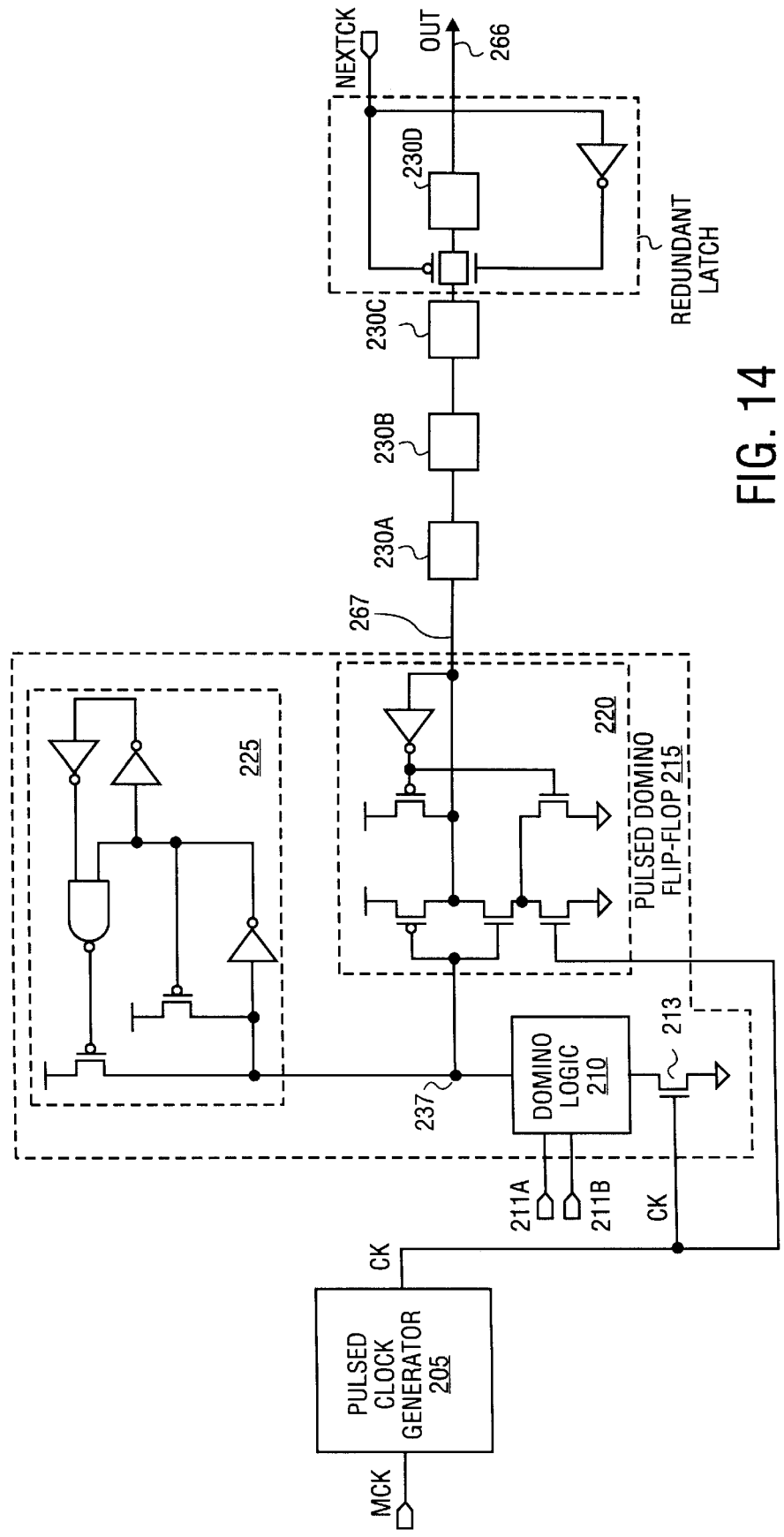
FIG. 14 is a schematic diagram of the pulsed topology of one embodiment including a fifth passgate blocker circuit configuration.
Figure 15:
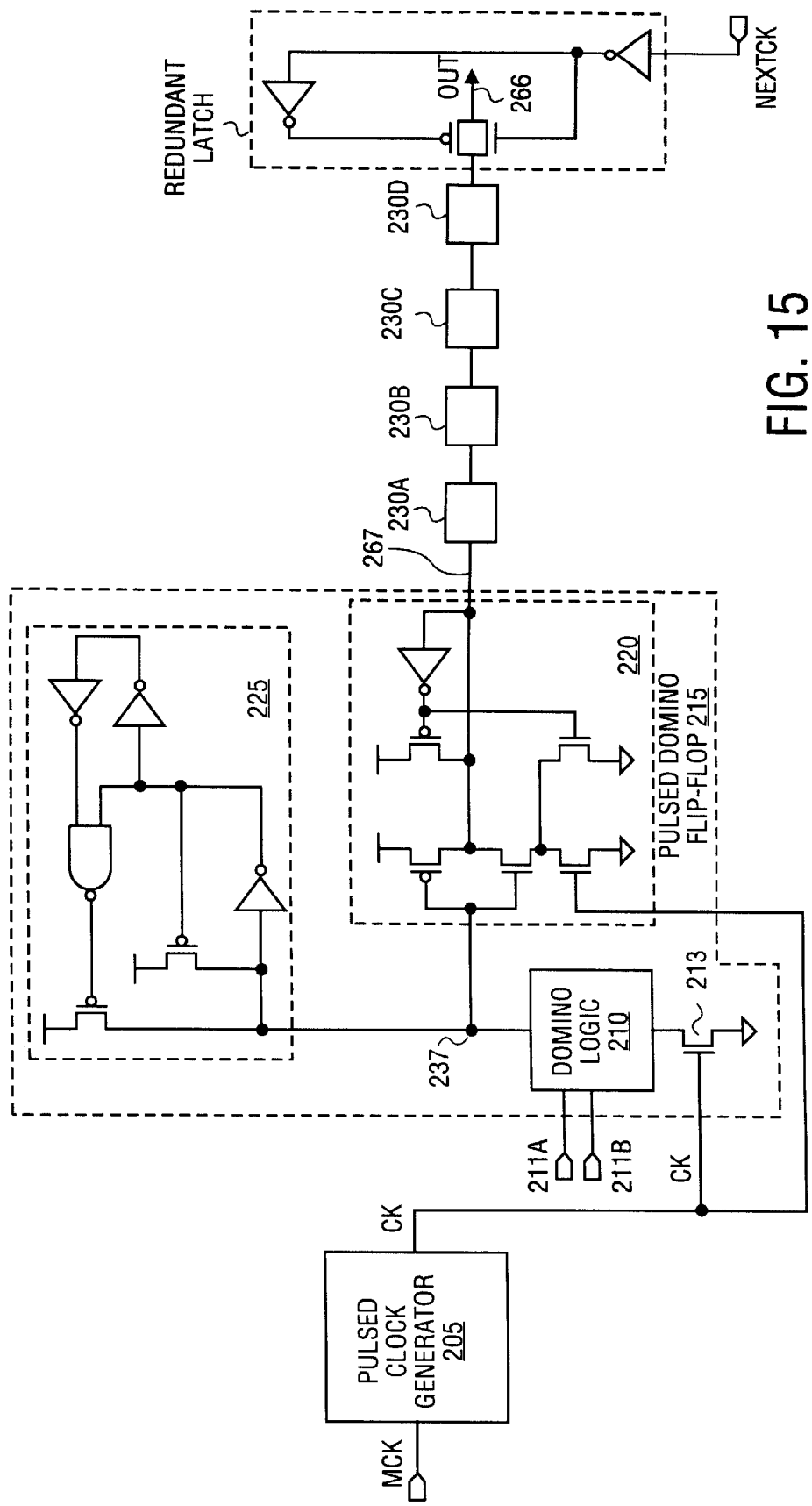
FIG. 15 is a schematic diagram of the pulsed topology of one embodiment including a sixth passgate blocker circuit configuration.

Each of the above examples of redundant latches is an example of a tristate full blocker. For other embodiments, a passgate blocker may instead be used. An example of one such passgate blocker 1005 is shown in FIG. 10. The passgate blocker 1005 operates in a similar manner to the tristate blockers discussed above to hold the signal at the point at which the blocker is provided. In this manner, the signal can be sampled by a subsequent pipestage while reducing the risk of min-delay race failures.

Comparing the passgate version versus the tristate version of the redundant latch, the passgate version of some embodiments is better for noise reduction and improving speedpaths while the tristate version is better for hold-related race conditions. FIGS. 11–15 show other illustrative examples of passgate redundant latch implementations that may be used for various embodiments with tradeoffs in margin to the various constraints depending on the clocking, which transistor is turned off first, etc. It will be appreciated that either of the passgate or tristate blocker circuits may be implemented in any one of a number various positions in the pipestage, only some of which are shown in the Figures. Where a tristate blocker circuit is shown in the Figures, a passgate blocker may be used instead and vice versa. Further details of blockers that may be used in various embodiments are provided in copending U.S. patent applications Ser. No. 09/467,214 entitled, "Pulsed Clock Signal Transfer with Dynamic Latching," filed Dec. 20, 1999, and U.S. Pat. No. 6,242,958 entitled, "Master Slave Flip-Flop as a Dynamic Latch," issued Jun. 5, 2001, both of which are assigned to the assignee of the present invention.

Figure 16:
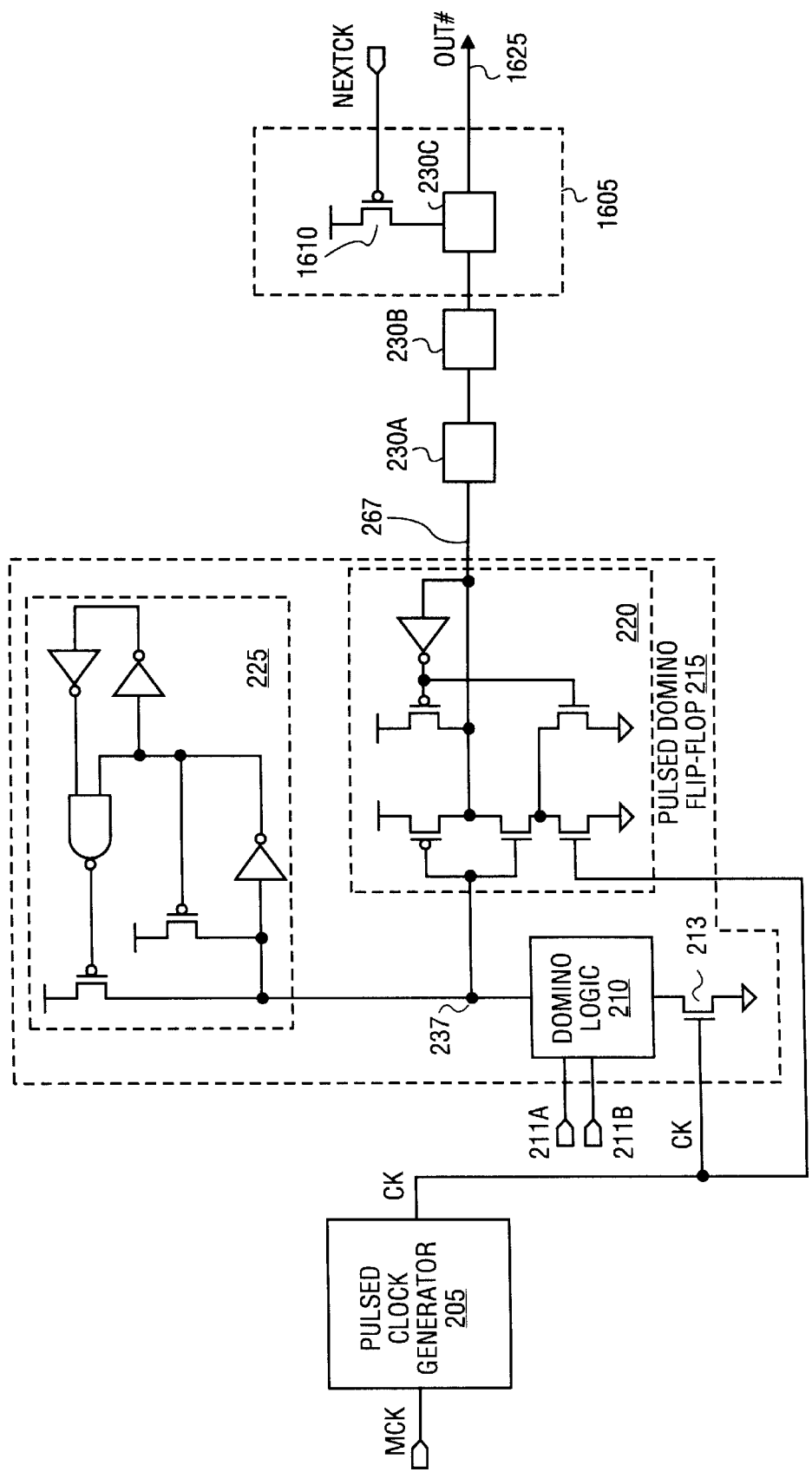
FIG. 16 is a schematic diagram of the pulsed circuit topology of one embodiment including a first type of half blocker circuit.

For some embodiments, instead of using a full redundant latch or full blocker, a half blocker may be used to block only the problematic transition (e.g. the low to high transition or the low to high transition). FIG. 16 shows an example of such a half blocker 1605. The half blocker 1605 includes a PFET 1610 coupled to the static logic stage 230c. The PFET 1610 may be coupled between the power supply and the static logic stage 230c as shown or between the pull-up network of the static logic stage 230c and the output of the static logic stage 230c.

During a pulse of the NextCk signal, the device 1610 is disabled such that the state of the data signal during a low to high transition is held for sampling by a subsequent pipestage (i.e. OUT# is protected from a low to high transition). A transition in the other direction, however, is not blocked by the blocker 1605. An inverted form of the output signal from the flip-flop 215 is provided at the output node 1625.

Figure 17:
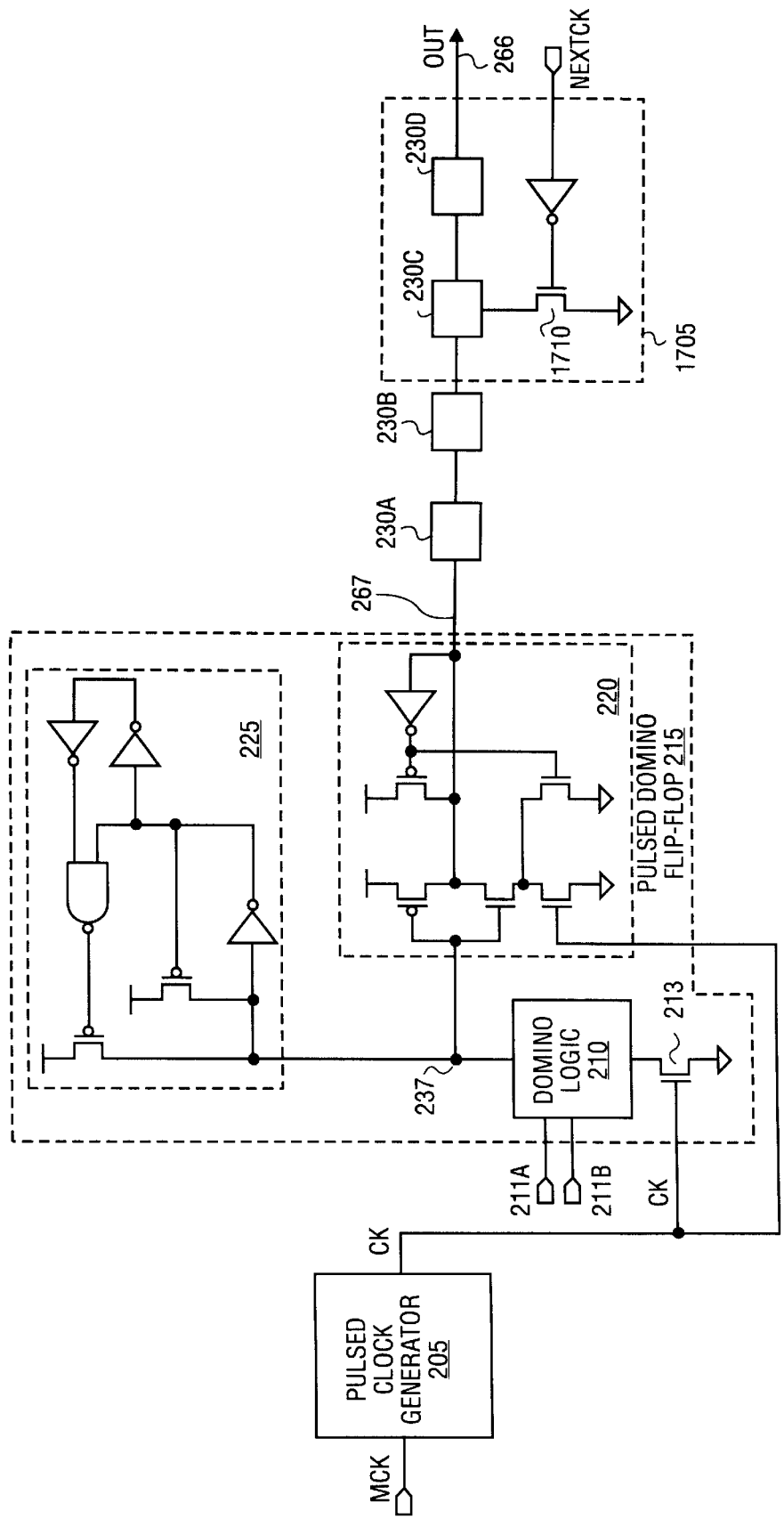
FIG. 17 is a schematic diagram of the pulsed circuit topology of one embodiment including a second type of half blocker circuit.

For another embodiment, as shown in FIG. 17, a half blocker 1705 includes an NFET 1710 that is coupled either between the static logic stage 230c and ground or between the pull-down network of the static logic stage 230c and the output of the static logic stage 230c. The NFET 1710 receives at its gate a complement of the NextCk signal such that it is disabled for each NextCk pulse. In this manner, a high to low transitioning output signal is blocked for sampling by a subsequent pipestage while a low to high signal transition is not blocked.

Such half blockers can be useful in blocking only the desired transition. For some embodiments, the full blocker implementations may be better for noise injection characteristics than the half blocker.

In the above-described embodiments, a pulsed circuit topology is described that provides for high frequency operation. For some embodiments, using receiver side circuitry, min-delay or other race condition protection may also be provided.

In the foregoing specification, the invention has been described with reference to specific exemplary embodiments thereof. It will, however, be appreciated that various modifications and changes may be made thereto without departing from the broader spirit and scope of the invention as set forth in the appended claims. For example, complementary logic may be used for some embodiments. The specification and drawings are, accordingly, to be regarded in an illustrative rather than a restrictive sense.

What is claimed is:

1. A circuit comprising:
    a domino logic gate having a domino output node responsive to input data during an evaluate pulse;
    reset circuitry to initiate and self-terminate a reset pulse, the domino output node to be precharged during the reset pulse; and
    a latch responsive to a first pulsed clock input signal to latch data indicated at the domino output node,
    wherein a hold high time associated with an input of the domino logic gate is a generation race condition while a hold low time associated with the input of the domino logic gate is a suppression race condition.

2. The circuit of claim 1 wherein the latch comprises a set-dominant latch if the domino logic gate is an n-type domino logic gate and wherein the latch comprises a reset-dominant latch if the domino logic gate is a p-type domino logic gate.

3. The circuit of claim 1 wherein the reset circuitry comprises self-timed reset circuitry to control a pulse width of the reset pulse.

4. The circuit of claim 3 wherein the reset circuitry comprises an atomic reset loop to both locally initiate and self-terminate the reset pulse.

5. The circuit of claim 4 wherein the reset pulse width is substantially equal to three unit delays and an evaluate pulse width is substantially equal to five unit delays.

6. The circuit of claim 1 wherein the reset circuitry comprises global reset circuitry to initiate the reset pulse in response to a pulsed clock signal.

7. The circuit of claim 1 further comprising
    at least one static logic stage coupled to the latch output; and
    receiver side circuitry coupled to the at least one static logic stage, the receiver side circuitry to interface the circuit to a subsequent circuit.

8. A circuit comprising:
    a domino logic gate having a domino output node responsive to input data during an evaluate pulse;
    reset circuitry to initiate and self-terminate a reset pulse, the domino output node to be precharged during the reset pulse;
    a latch responsive to a first pulsed clock input signal to latch data indicated at the domino output node;
    at least one static logic stage coupled to the latch output; and
    an edge shifter circuit to delay a transition in one direction of a data signal from the latch output by a first number of unit delays and to delay a transition of the data signal in the other direction by a second, larger number of unit delays.

9. The circuit of claim 8 wherein the edge shifter comprises fewer than eight transistors.

10. The circuit of claim 8 wherein the second number of unit delays minus the first number of unit delays is less than one.

11. A circuit comprising:
    a domino logic gate having a domino output node responsive to input data during an evaluate pulse;
    reset circuitry to initiate and self-terminate a reset pulse, the domino output node to be precharged during the reset pulse;
    a latch responsive to a first pulsed clock input signal to latch data indicated at the domino output node;
    at least one static logic stage coupled to the latch output; and
    a redundant latch to hold a data signal from the latch output during a pulse of a second pulsed clock signal, the second pulsed clock signal being used to clock the subsequent circuit.

12. The circuit of claim 11 wherein the redundant latch comprises a tristate blocker circuit.

13. The circuit of claim 11 wherein the redundant latch comprises a passgate blocker circuit.

14. A circuit comprising:

a domino logic gate having a domino output node responsive to input data during an evaluate pulse;

reset circuitry to initiate and self-terminate a reset pulse, the domino output node to be precharged during the reset pulse;

a latch responsive to a first pulsed clock input signal to latch data indicated at the domino output node;

at least one static logic stage coupled to the latch output; and a half blocker circuit, the half blocker circuit responsive to a second pulsed clock signal associated with the subsequent circuit to block a data signal from the latch output if the data signal is at a first logic level and to transmit the data signal if the data signal is at a second logic level.

15. The circuit of claim 14 wherein the latch is responsive to the pulsed clock signal to be reset for each cycle of the pulsed clock signal.

16. The circuit of claim 14 wherein, if the domino logic stage includes n-type transistors, the latch is a set-dominant latch.

17. The circuit of claim 14 wherein, if the domino logic stage includes p-type transistors, the latch is a reset-dominant latch.

18. The circuit of claim 14 wherein the reset circuitry comprises an atomic reset loop to initiate the reset pulse in response to a voltage level at the domino output node.

19. The circuit of claim 18 wherein the reset pulse and an evaluate pulse both occur within a pulsed clock cycle time equal to 8 unit delays or fewer.

20. The circuit of claim 14 wherein the pulsed clock signal has a frequency that is a multiple of a frequency of a separate clock signal used to clock other circuitry on an integrated circuit device that includes the circuit.

21. The circuit of claim 14 wherein a clock load comprises a single field effect transistor (FET) device.

22. The circuit of claim 14 wherein only a true form of the pulsed clock signal is received.

* * * * *